(12) United States Patent
Ogura et al.

(10) Patent No.: US 9,224,844 B2
(45) Date of Patent: Dec. 29, 2015

(54) SEMICONDUCTOR DEVICE

(71) Applicant: Kabushiki Kaisha Toshiba, Minato-ku, Tokyo (JP)

(72) Inventors: Tsuneo Ogura, Kamakura Kanagawa (JP); Tomoko Matsudai, Shibuya Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 14/483,775

(22) Filed: Sep. 11, 2014

(65) Prior Publication Data
US 2015/0263148 A1    Sep. 17, 2015

(30) Foreign Application Priority Data
Mar. 14, 2014 (JP) ................................. 2014-052704

(51) Int. Cl.
*H01L 27/148* (2006.01)
*H01L 29/768* (2006.01)
(Continued)

(52) U.S. Cl.
CPC ........ *H01L 29/7395* (2013.01); *H01L 29/0626* (2013.01); *H01L 29/1095* (2013.01)

(58) Field of Classification Search
CPC ............. H01L 21/043; H01L 21/0425; H01L 21/2011; H01L 21/2252; H01L 21/3242; H01L 21/28079; H01L 21/02529; H01L 21/02576; H01L 21/02579; H01L 21/041; H01L 27/0647; H01L 27/075; H01L 27/098; H01L 27/1022; H01L 29/1004; H01L 29/1058; H01L 29/41708; H01L 29/868; H01L 29/66136; H01L 29/7393; H01L 29/7395

USPC ......... 257/219, 148, 152, 196, 197, 200, 201, 257/279, 321, 322, 480, 481, 544, 557, 565, 257/577, 603, E21.004, E21.006, E21.008, 257/E21.042, E21.053, E21.054, E21.056, 257/E21.121, E21.129, E21.135, E21.173, 257/E21.352, E21.372, E21.382
See application file for complete search history.

(56) References Cited

U.S. PATENT DOCUMENTS 6,388,306 B1 * 5/2002 Hirano et al. .................. 257/551
7,187,041 B2 * 3/2007 Mizokuchi et al. ........... 257/401
(Continued)

FOREIGN PATENT DOCUMENTS

| JP | 2007-258363 A | 10/2007 |
| JP | 2009-141202 A | 6/2009 |

(Continued)

OTHER PUBLICATIONS

Tsuneo Ogura et al., "Semiconductor Device", U.S. Appl. No. 14/792,307, filed Jul. 6, 2015 (40 pages).

Primary Examiner — David Nhu
(74) Attorney, Agent, or Firm — White & Case LLP

(57) ABSTRACT

According to one embodiment, a semiconductor device includes a first electrode, a second electrode, a first semiconductor layer, a first semiconductor region, a second semiconductor region, and an insulating layer. The first semiconductor layer is provided between the first electrode and the second electrode, and contacts the first electrode. The first semiconductor region is provided between the first semiconductor layer and the second electrode, and contacts the second electrode. The second semiconductor region is provided between the first semiconductor region and the second electrode, and contacts the second electrode. An impurity concentration of the second semiconductor region is higher than an impurity concentration of the first semiconductor region. An insulating layer has one end contacting the second electrode and the other end positioned in the first semiconductor layer. The insulating layer extends along the second electrode in a first direction from the first electrode towards the second electrode.

20 Claims, 20 Drawing Sheets

(51) Int. Cl.
  *H01L 29/739* (2006.01)
  *H01L 29/06* (2006.01)
  *H01L 29/10* (2006.01)

(56) References Cited

U.S. PATENT DOCUMENTS

| | | | | |
|---|---|---|---|---|
| 7,952,143 B2* | 5/2011 | Soeno et al. | ............ | 257/341 |
| 8,248,116 B2* | 8/2012 | Soeno et al. | ............ | 327/108 |
| 8,664,692 B2* | 3/2014 | Ogura et al. | ............ | 257/139 |
| 2014/0061875 A1 | 3/2014 | Ogura et al. | | |
| 2014/0070266 A1 | 3/2014 | Matsudai et al. | | |
| 2014/0124832 A1 | 5/2014 | Ogura et al. | | |
| 2014/0284658 A1 | 9/2014 | Matsudai et al. | | |

FOREIGN PATENT DOCUMENTS

| | | |
|---|---|---|
| JP | 2010-067901 A | 3/2010 |
| JP | 2011-199041 A | 10/2011 |
| JP | 2011-238872 A | 11/2011 |
| JP | 4893609 B2 | 3/2012 |
| JP | 2013008779 A | 1/2013 |

* cited by examiner

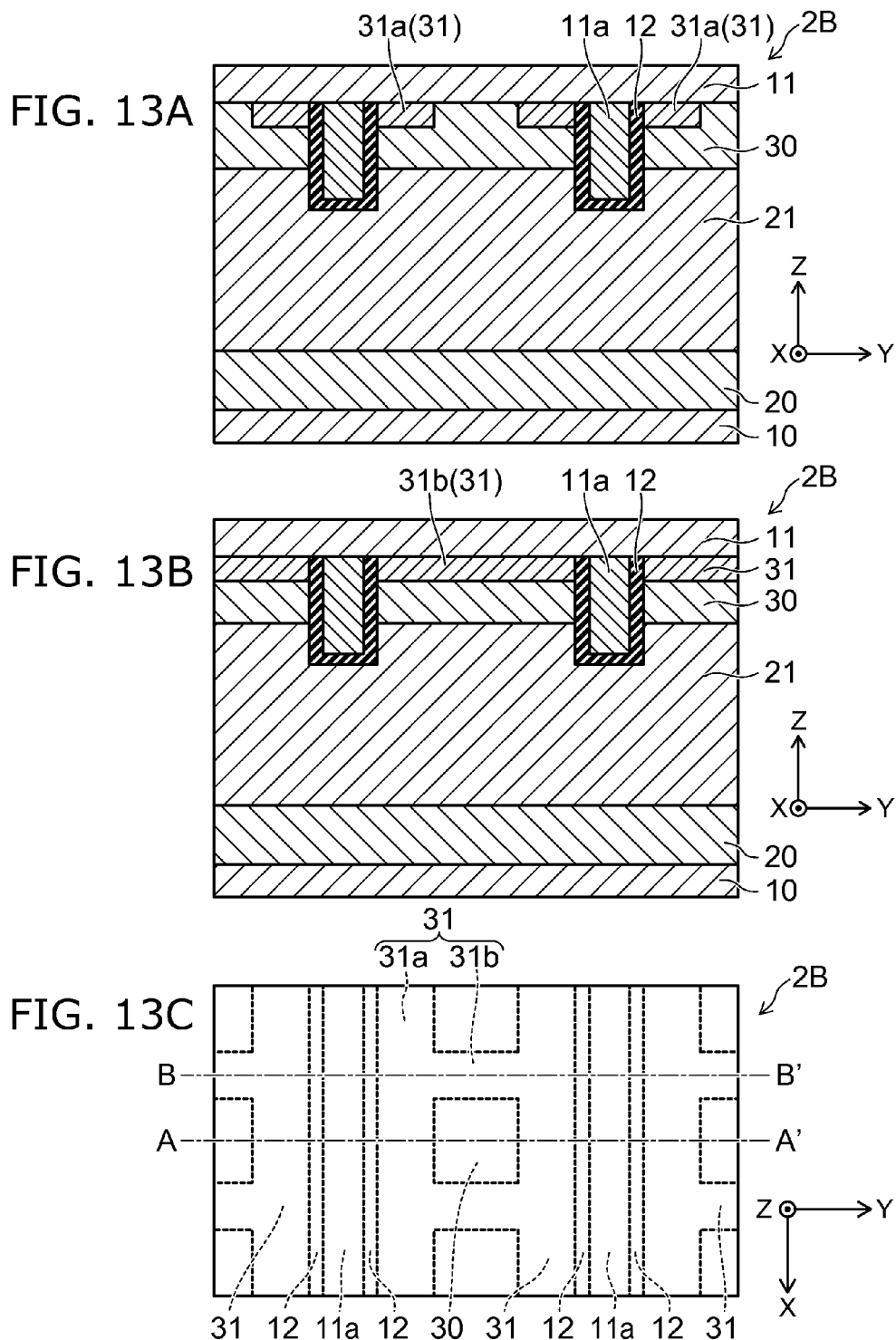

SEMICONDUCTOR DEVICE

CROSS-REFERENCE TO RELATED APPLICATIONS

This application is based upon and claims the benefit of priority from Japanese Patent Application No. 2014-052704, filed on Mar. 14, 2014; the entire contents of which are incorporated herein by reference.

FIELD

Embodiments described herein relate generally to a semiconductor device.

BACKGROUND

In recent years, insulated gate bipolar transistors (IGBT), diodes, and the like have been used as semiconductor devices used in power conversion devices such as inverters. Diodes are conventionally connected to IGBTs in an anti-parallel manner and are used as refluxing diodes. Because of this, the diodes are sometimes referred to as free wheeling diodes (FWD).

To improve characteristics of power conversion devices such as inverters, it is critical that FWD characteristic improvements are performed in parallel with IGBT characteristic improvements. Important characteristics of the FWDs include an ON voltage (that is, a voltage drop in a conduction state), a recovery time (that is, an annihilation time of a recovery current upon recovery), a safe operation area upon recovery (that is, a region not destroyed even if a voltage is applied in a state where the recovery current is flowing), and the like. Moreover, a smaller current and voltage oscillation during recovery is more desirable. Among these, widening the safe operation area during recovery while shortening the recovery time is critical.

BRIEF DESCRIPTION OF THE DRAWINGS

FIG. 13A and FIG. 13B are schematic cross-sectional views of a semiconductor device according to a first variation of the second embodiment, and FIG. 13C is a schematic plan view of the same device;

DETAILED DESCRIPTION

Figure 1:
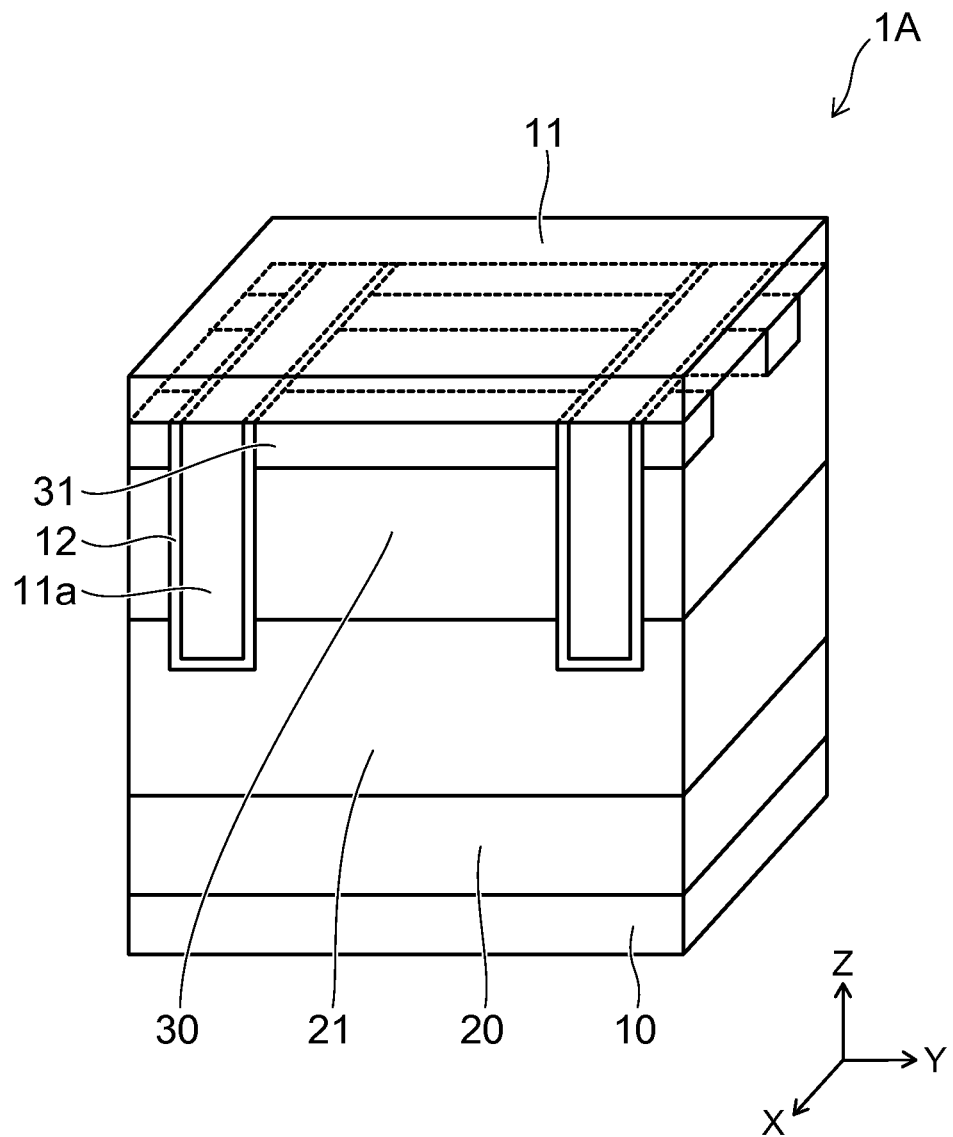
FIG. 1 is a schematic three-dimensional view of a semiconductor device according to a first embodiment.

According to one embodiment, a semiconductor device includes a first electrode, a second electrode, a first semiconductor layer of a first conductivity type, a first semiconductor region of a second conductivity type, a second semiconductor region of the second conductivity type, and an insulating layer. The first semiconductor layer is provided between the first electrode and the second electrode, and contacts the first electrode. The first semiconductor region is provided between the first semiconductor layer and the second electrode, and contacts the second electrode. The second semiconductor region is provided between the first semiconductor region and the second electrode, and contacts the second electrode. An impurity concentration of the second semiconductor region is higher than an impurity concentration of the first semiconductor region. An insulating layer has one end contacting the second electrode and the other end positioned in the first semiconductor layer. The insulating layer extends along the second electrode in a first direction from the first electrode towards the second electrode.

Various embodiments will be described hereinafter with reference to the accompanying drawings. In the following description, the same reference numeral is applied to the same member, and for members that have been described once, the description is omitted as appropriate.

First Embodiment

FIG. 1 is a schematic three-dimensional view of a semiconductor device according to a first embodiment.

Figure 2A:
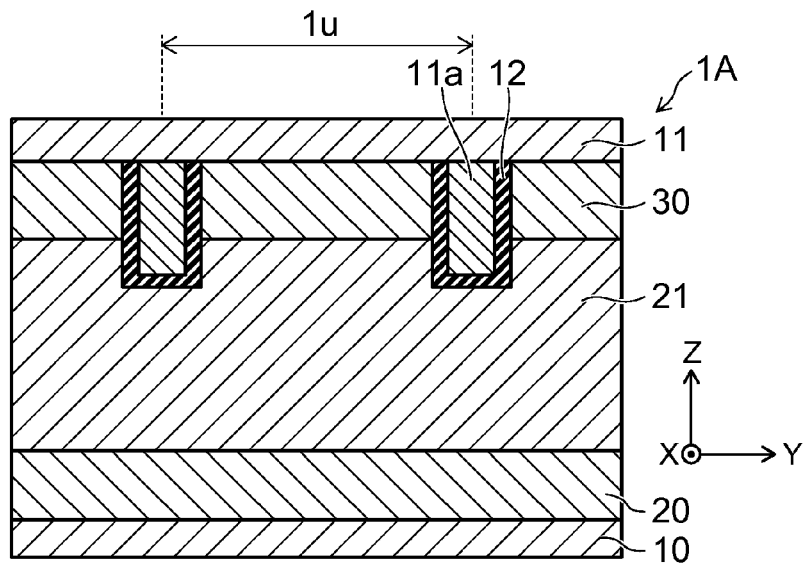
FIG. 2A and FIG. 2B are schematic cross-sectional views of the semiconductor device according to the first embodiment.
Figure 2B:
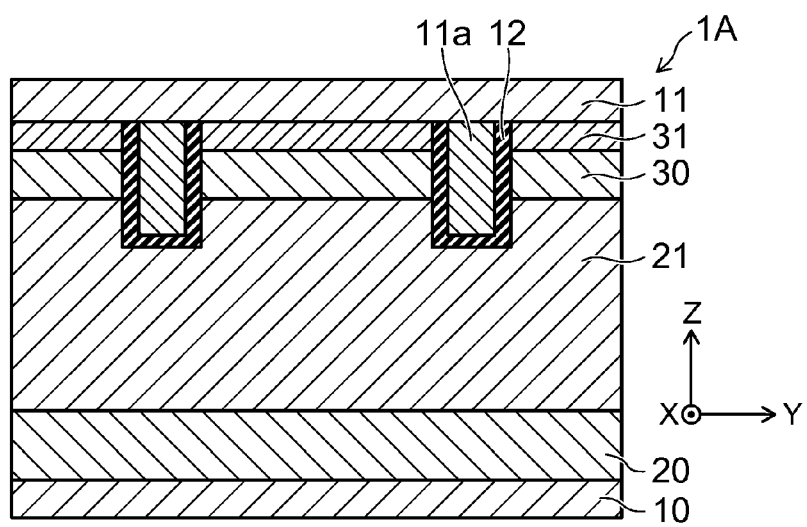
Figure 2C:
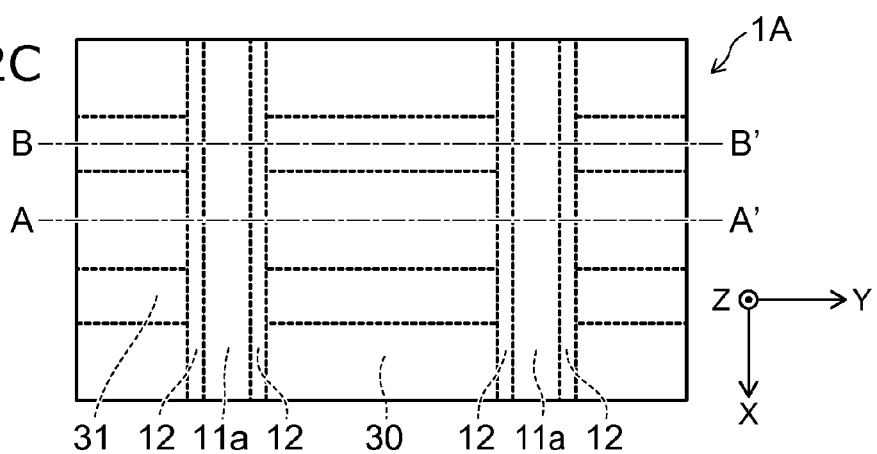
FIG. 2C is a schematic plan view of the same device.

FIG. 2A and FIG. 2B are schematic cross-sectional views of the semiconductor device according to the first embodiment, and FIG. 2C is a schematic plan view of the same device.

An A-A' cross-section of FIG. 2C is represented in FIG. 2, and a B-B' cross-section of FIG. 2C is represented in FIG. 2B. A range 1u shown in FIG. 2A is a minimum unit range of a semiconductor device 1A. The semiconductor device 1A provides the following results of action by a minimum unit.

The semiconductor device 1A according to the first embodiment is generally a type of p-intrinsic-n (PIN) diode. The semiconductor device 1A is used as, for example, a refluxing diode of an inverter circuit or the like.

The semiconductor device 1A is provided with a cathode electrode 10 (first electrode), an anode electrode 11 (second electrode), an $n^+$-type semiconductor layer 20, an n-type semiconductor layer 21, a p-type semiconductor region 30 (first semiconductor region), a $p^+$-type semiconductor region 31 (second semiconductor region), a connection region 11a, and an insulating layer 12. Note that the semiconductor layer 20 and the semiconductor layer 21 combined to make up the first semiconductor layer.

The semiconductor layer 20 is provided between the cathode electrode 10 and the anode electrode 11. The semiconductor layer 20 contacts the cathode electrode 10. The semiconductor layer 20 is in ohmic contact with the cathode electrode 10. The semiconductor layer 21 is provided between the semiconductor layer 20 and the anode electrode 11. The semiconductor layer 21 contacts the semiconductor layer 20.

Here, a concentration of impurity elements contained in the semiconductor layer 21 may be set lower than a concentration of impurity elements contained in the semiconductor layer 20 on a face where the semiconductor layer 20 contacts the cathode electrode 10. Furthermore, an n-type buffer layer (not illustrated) may be provided between the semiconductor layer 21 and the semiconductor layer 20. An impurity concentration of the buffer layer is a value between the concentration of impurity elements contained in the semiconductor layer 21 and the concentration of impurity elements contained in the semiconductor layer 20.

The semiconductor region 30 is provided between the semiconductor layer 21 and the anode electrode 11. The semiconductor region 30 contacts the anode electrode 11 and the semiconductor layer 20. With the semiconductor region 30, the surface thereof contacts the anode electrode 11. An impurity concentration of the semiconductor region 30 may be lower when compared to the semiconductor region 31 and may or may not be in Schottky contact with the anode electrode 11. A film thickness of the semiconductor region 30 is, for example, 0.5 μm (micrometers) to 10 μm.

The semiconductor region 31 is provided between the semiconductor region 30 and the anode electrode 11. A plurality of the semiconductor layers 31 are provided, and each extends in a direction (for example, a Y-direction) crossing a direction (for example, a Z-direction) from the cathode electrode 10 toward the anode electrode 11. In addition, each of the semiconductor regions 31 is arrayed in a direction (for example, an X-direction) crossing the Z-direction and the Y-direction. In other words, the semiconductor region 31 which has a high concentration is made of multiple regions aligned in the X-direction.

Further, the semiconductor region 31 contacts the semiconductor region 30, the anode electrode 11, and the insulating layer 12. In other words, portions other than where the semiconductor region 31 contacts the anode electrode 11 and the insulating layer 12, contact the semiconductor region 30. The impurity concentration of the semiconductor region 31 is higher than the impurity concentration of the semiconductor region 30. The semiconductor region 31 is in ohmic contact with the anode electrode 11. A film thickness of the semiconductor region 31 is, for example, 0.1 μm to 5 μm.

For example, the concentration of the impurity elements contained in the semiconductor region 31 on the face where the semiconductor region 31 contacts the anode electrode 11 is higher than the concentration of the impurity elements contained in the semiconductor region 30 on the face where the semiconductor region 30 contacts the anode electrode 11.

The connection region 11a electrically contacts the anode electrode 11. The connection region 11a extends from the anode electrode 11 toward the cathode electrode 10, and reaches the semiconductor layer 21. The insulating layer 12 is provided between the connection region 11a and the semiconductor layer 21 and between the connection region 11a and the semiconductor regions 30 and 31. Note that the connection region 11a may be replaced with an insulating layer with the same material as the insulating layer 12 (the same as in the embodiment). Here, one end of this insulating layer contacts the anode electrode 11, and the other end is positioned in the semiconductor layer 21. Further, this insulating layer extends in a direction from the anode electrode 11 toward the cathode electrode 10 along the anode electrode 11.

The connection region 11a and the insulating layer 12 extend in, for example, the X-direction. The connection region 11a and the insulating layer 12 are arrayed in, for example, the Y-direction. That is to say, the connection region 11a and the semiconductor region 31 cross when viewing the semiconductor device 1A from above.

As described above, the semiconductor region 31 extends in, for example, the Y-direction crossing the X-direction without extending in the X-direction. In the X-direction, there is a region where the semiconductor region 31 is provided and a region where the semiconductor region 31 is not provided. For example, in the semiconductor device 1A, a portion sandwiched by the adjacent connection regions 11a is structured in the X-direction so that the region where the semiconductor region 31 is not disposed and the region where the semiconductor region 31 is disposed are alternately arrayed. In other words, the semiconductor region 31 is disposed to be thinned in the X-direction. Note that the semiconductor region 31 contacts the insulating layer 12.

An operation of the semiconductor device 1A will be described.

Figure 3A:
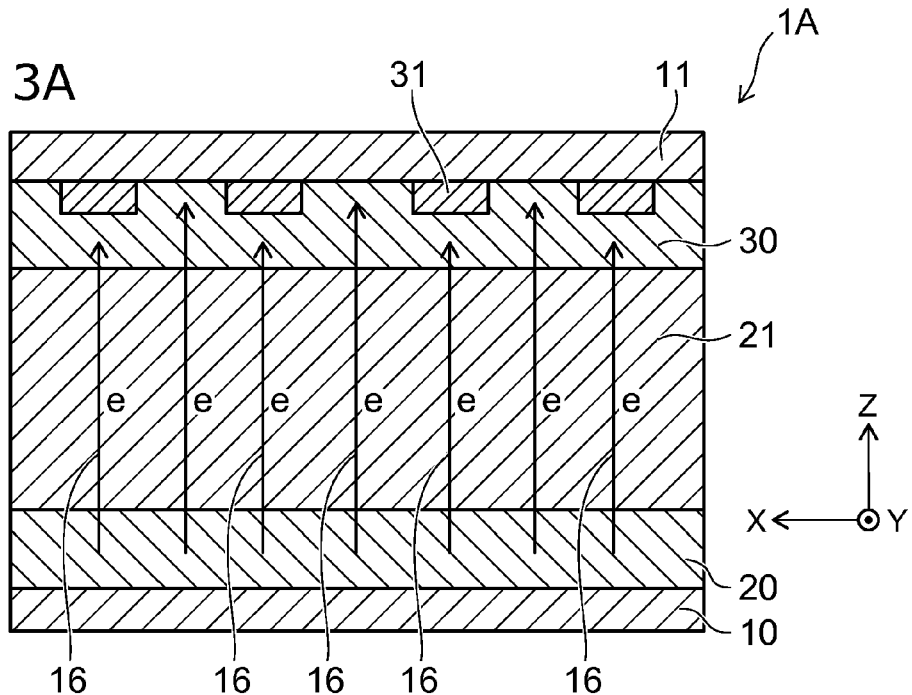
FIG. 3A and FIG. 3B are schematic cross-sectional views illustrating an ON operation of the semiconductor device according to the first embodiment.
Figure 3B:
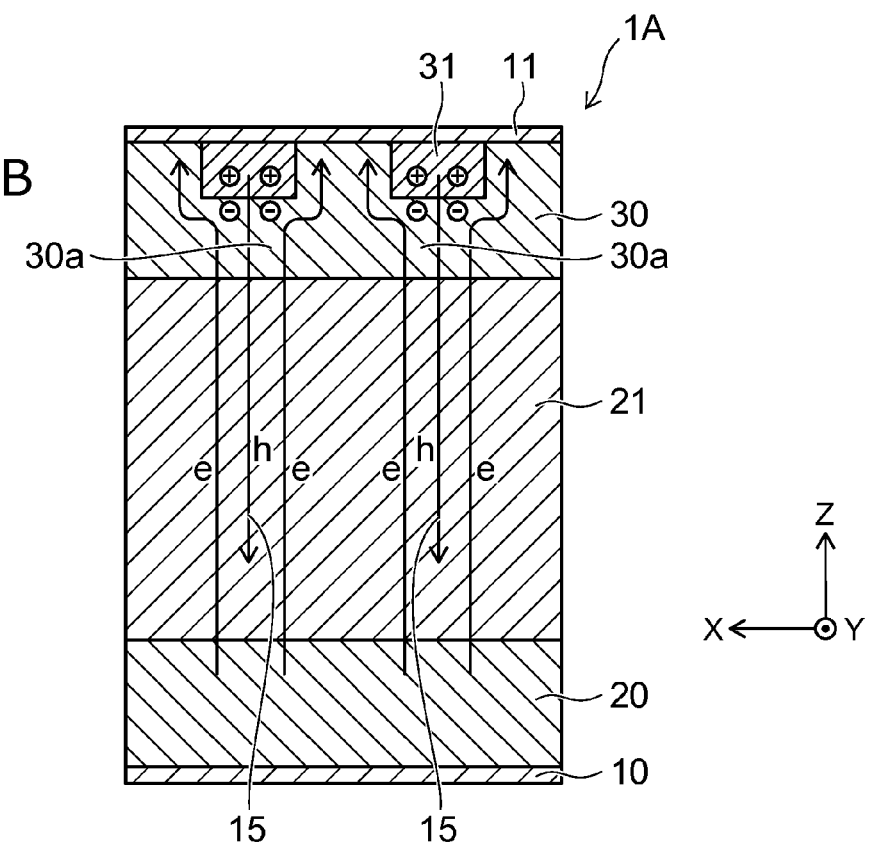

FIG. 3A and FIG. 3B are schematic cross-sectional views illustrating an ON operation of the semiconductor device according to the first embodiment.

First, an electron current flowing from a cathode side to an anode side will be described using FIG. 3A. Here, a cross-section of the semiconductor device 1A cut on an X-Z plane is represented in FIG. 3.

When ON state, forward bias voltage is applied between the cathode and the anode. In other words, voltage is applied between the cathode and the anode so that the potential of the anode electrode 11 is higher than the potential of the cathode electrode 10. For example, the anode electrode 11 is a positive electrode, and the cathode electrode 10 is a negative electrode.

Here, the semiconductor layer 20 is in ohmic contact with the cathode electrode 10. Therefore, electrons (e) reach the semiconductor region 30 from the semiconductor layer 20 via the semiconductor layer 21.

The semiconductor region 30 is in resistive contact or Schottky contact with the anode electrode 11. In other words, this contact is a resistive contact or a Schottky contact by a p-type semiconductor and a metal. Therefore, a junction between the semiconductor region 30 and the anode electrode 11 becomes an energy barrier for holes (h), but not an energy barrier for the electrons (e).

Therefore, the electrons (e) flow to the anode electrode 11 from the semiconductor layer 20 via the semiconductor layer 21 and the semiconductor region 30. Thereby, an electron current 16 is formed between the cathode and the anode.

Next, a hole current flowing from the anode side to the cathode side will be described using FIG. 3B. A junction between the semiconductor region 30 and the anode electrode 11 does not become an energy barrier for the electrons (e). However, a junction between the semiconductor region 31 which is a p-type high concentration layer and the semiconductor region 30 which is a p-type low concentration layer becomes an energy barrier for the electrons (e). Therefore, it becomes hard for the electrons (e) which flow to the semiconductor region 30 directly below the semiconductor region 31 to flow to the semiconductor region 31.

Thereby, the electrons (e) reach the vicinity of the semiconductor region 31 after flowing in the direction from the cathode side to the anode side and afterwards move in a direction substantially parallel to a lateral direction, in other words, the Y-direction, on the lower part of the semiconductor region 31.

Through this movement of the electrons (e), the semiconductor region 31 contacting the anode electrode 11 becomes a positive electrode, and a portion 30a positioned on the lower part of the semiconductor region 31 is biased so as to become a negative electrode with respect to the semiconductor region 31.

The bias formed between the portion 30a and the anode electrode 11 lowers the energy barrier against the holes between the semiconductor region 30 and the semiconductor region 31 on the lower part of the semiconductor region 31. Thereby, the holes (h) are injected from the semiconductor region 31 to the semiconductor region 30. A hole current 15 is formed by these injected holes (h).

The greater the width in the Y-direction of the semiconductor region 31, or the greater the contact area of the semiconductor region 31 and the anode electrode 11 is, the more the hole current 15 increases. In other words, the injection amount of holes from the anode side is adjusted according to the width or the contact area.

Note that when ON state, a forward bias is applied between the semiconductor region 30 and the semiconductor layer 21. Therefore, it is self-evident that holes and electrons flow between pn junctions.

In this manner, when ON state, holes flow from the anode side to the cathode side, and electrons flow from the cathode side to the anode side. Here, with the anode side, the injection amount of holes from the semiconductor region 30 is fewer compared to the injection of holes from the semiconductor region 31, and the semiconductor region 30 mainly contributes to electron discharge. Thereby, recovery speed can be sped up in the semiconductor device 1A.

Specifically, in the semiconductor device 1A, the contact area of the semiconductor region 31 and the anode electrode 11 decreases in the X-direction because there is a region where the semiconductor region 31 is provided and a region where the semiconductor region 31 is not provided. Thereby, the injection amount of holes from the anode side is suppressed in the semiconductor device 1A, and recovery speed is sped up.

In a trench structure of this embodiment, even if the semiconductor region 31 is thinned out in the Y-direction, low injection for holes cannot be sufficiently performed because a distance between trenches is 1 μm to 6 μm. Because of this, it was first discovered that a structure where the semiconductor region 31 is thinned out in the X-direction is effective.

As an effective dimension example for realizing this kind of thinning out, the width of the semiconductor region 31 is, for example, 0.5 μm to 5 μm, and a distance (1 pitch) in the X-direction between the center of the semiconductor region 31 and the center of the adjacent semiconductor region 31 is 1 μm to 20 μm.

Further, the distance (1 pitch) between the center of the connection region 11a and the center of a connection region 11a adjacent to this connection region 11a is, as described above, for example, 1 μm to 6 μm.

Figure 4A:
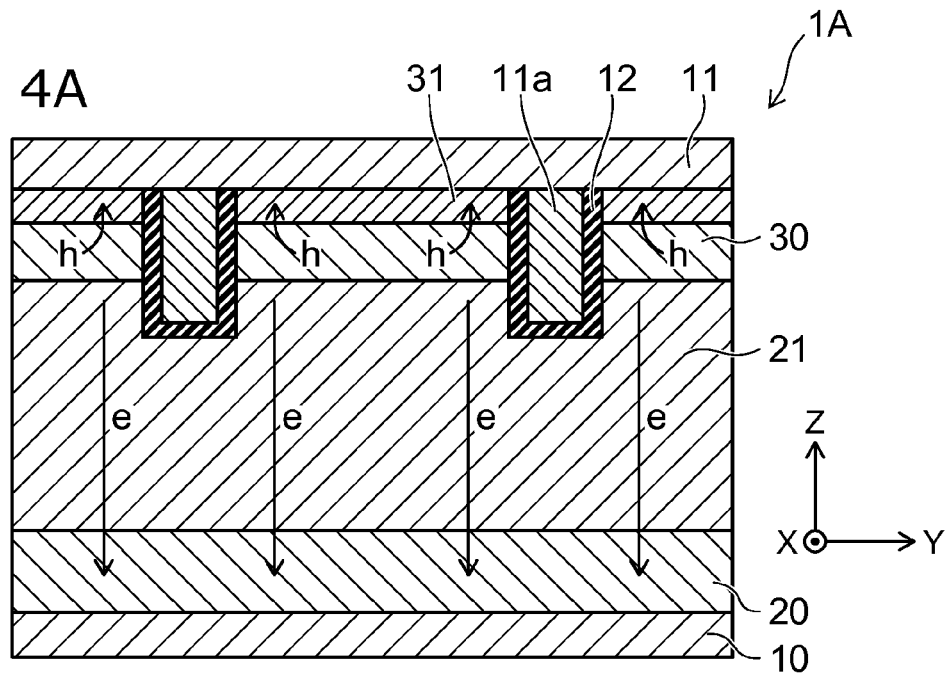
FIG. 4A and FIG. 4B are cross-sectional views representing an operation of a recovery state of the semiconductor device according to the first embodiment.
Figure 4B:
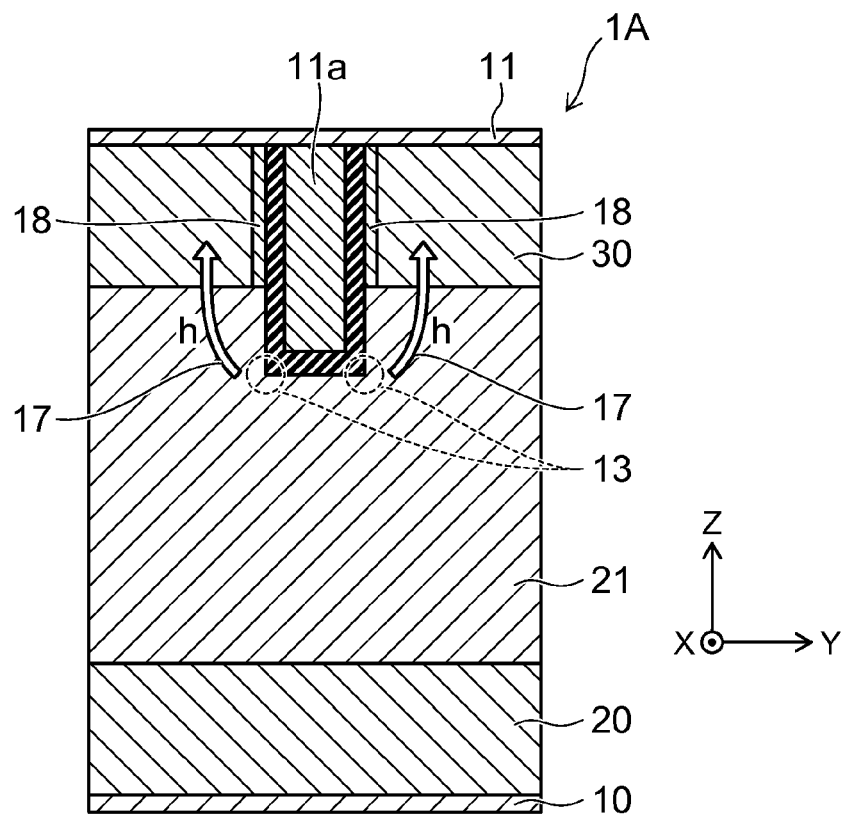

FIG. 4A and FIG. 4B are cross-sectional views representing an operation of a recovery state of the semiconductor device according to the first embodiment.

Represented in FIG. 4A is a state during recovery where a bias of a reverse direction is applied from a state where a bias of a forward direction is applied between the anode and the cathode. Here, a voltage is applied between the cathode and the anode so the anode electrode 11 is a negative electrode and the cathode electrode 10 is a positive electrode.

When a bias in the reverse direction is applied between the anode and the cathode from the state where the bias in the forward direction is applied between the anode and the cathode, holes (h) present in the semiconductor layer 21 move to a side of the anode electrode 11. Moreover, the electrons (e) present in the semiconductor layer 21 move to a side of the cathode electrode 10.

When a reverse bias is applied, the electrons (e) flow to the cathode electrode 10 via the semiconductor layer 20. Meanwhile, holes (h) flow to the anode electrode 11 via the semiconductor region 31 when an opposite bias is applied.

During recovery, while electrons flow to the cathode electrode 10 and holes flow to the anode electrode 11, the depletion layer spreads to the semiconductor layer 21 and the semiconductor region 30 with the junction of the semiconductor region 30 and the semiconductor layer 21 is as a starting point. Thereby, conduction between the anode electrode 11 and the cathode electrode 10 in the semiconductor device 1A is gradually cut off. However, in a PIN diode, there is generally a situation where electric field concentration occurs at any location of a PN junction during recovery to induce an avalanche. In the first embodiment, an adverse effect induced by this avalanche is suppressed and a safe operation area during recovery is enlarged.

FIG. 4B illustrates an operation of the recovery state of the semiconductor device 1.

For example, when a set of the connection region 11a and the insulating layer 12 is referred to as a trench region, the semiconductor device 1A has a corner portion 13 where the junction of the trench region and the semiconductor layer 21 sharply bends on the lower end of the trench region. An electric field can be easily focused on this corner portion 13 during recovery. Therefore, avalanches occur easily near the corner portion 13. A flow of holes (h) generated by the avalanche is defined as an avalanche current 17.

Here, the semiconductor region 31 contacts the insulating layer 12. In other words, because the semiconductor region 31 is positioned at least in the vicinity directly above the corner portion 13, the holes (h) generated by the avalanche are discharged to the anode electrode 11 via the semiconductor region 31.

Furthermore, a plurality of corner portions 13 is provided in the semiconductor device 1A. In the semiconductor device 1A, because avalanche occurs easily at each of the plurality of corner portions 13, locations where the avalanches occur are dispersed. Therefore, avalanche current is also dispersed near each of the plurality of corner portions 13. Then, avalanche current is discharged to the anode electrode 11 via each of the plurality of semiconductor regions 31. Thereby, a breakdown resistance of the semiconductor device 1A during recovery increases.

Further, in the semiconductor device 1A, avalanche current is discharged with priority to the anode electrode 11 via the semiconductor region 31. Because of this, it becomes possible to further suppress the injection of holes from the anode side while further lowering the impurity concentration of the semiconductor region 30.

Furthermore, because an identical negative potential is applied to the connection region 11a during recovery as the anode electrode 11, a layer 18 whose hole concentration is increased is induced along the insulating layer 12 in the semiconductor region 30. This layer 18 is a layer with low resistance for the holes (h). That is, forming the layer 18 of low resistance further increases the efficiency of the holes (h) being discharged to the anode electrode 11. In this manner, breakdown resistance during recovery can be increased because the avalanche current is discharged to the anode electrode even in a region without a semiconductor region 31.

Further, in the semiconductor device 1A, an n-type (or $n^+$-type) semiconductor region (referred to below as the additional n-type layer) is not provided between the anode electrode 11 and the semiconductor region 30. Therefore, in the semiconductor device 1A, there are no npn transistor regions, and there are no adverse effects induced when an npn transistor runs. In other words, because the anode electrode 11 is negatively biased with respect to the cathode electrode 10 during recovery, there are adverse effects such as electrons being injected from the additional n-type layer, an increase of recovery current, and an increase of recovery loss. Furthermore, because the depletion layer spreads to substantially all of the n-type semiconductor layer 21 region when static breakdown voltage is applied, there is an adverse effect of an increase in leakage current due to an increase in the current amplification factor of the npn transistor made up of the additional n-type layer, the p-type semiconductor region 30, and the n-type semiconductor layer 20.

As described above, with the semiconductor device 1A according to the first embodiment, both speeding up the recovery speed and increasing the breakdown resistance during recovery, that is, enlarging the safe operation area, can be achieved. In this manner, by having a trench region and using the anode structure unique to this embodiment, simultaneously improving the breakdown resistance during recovery and the speeding up by the reduction of hole injection from the anode was first presented in this embodiment.

Further, in the embodiment, the semiconductor layer 20 may be replaced with an $n^+$-type cathode layer, the semiconductor layer 21 may be replaced with an n-type base layer, and each of the semiconductor regions 30 and 31 may be replaced with a p-type anode region.

A main component of each of the semiconductor layers 20 and 21, and each of the semiconductor regions 30 and 31 is, for example, silicon (Si). Phosphorus (P), arsenic (As), or the like, for example, is applied as an impurity element of a conductivity type (first conductivity type) such as an $n^+$-type or an n-type. Boron (B) or the like, for example, is applied as an impurity element of a conductivity type (second conductivity type) such as a $p^+$-type or a p-type. Moreover, other than silicon (Si), the main component of each of the semiconductor layers 20 and 21 and each of the semiconductor regions 30 and 31 may be silicon carbide (SiC), gallium nitride (GaN), or the like.

Further, when the concentration of the impurity element included in the semiconductor on a face contacting the electrode is defined as the surface impurity concentration, the surface impurity concentration of the semiconductor layer 20 is larger than $3\times10^{17}$ $cm^{-3}$ (atoms/$cm^3$), for example, and $1\times10^{18}$ $cm^{-3}$ or greater. The impurity concentration of the semiconductor layer 20 may be set to increase heading toward the cathode electrode 10. The impurity concentration of the semiconductor layer 21 is, for example, $1\times10^{15}$ $cm^{-3}$ or less and can be set to any impurity concentration by a breakdown voltage design of an element. It is desirable for the surface impurity concentration of the semiconductor region 30 to be under $3\times10^{17}$ $cm^{-3}$. The surface impurity concentration of the semiconductor region 31 is higher than $3\times10^{17}$ $cm^{-3}$ and is, for example, $1\times10^{19}$ $cm^{-3}$ or greater. These impurity concentrations of the p-type semiconductor regions may be set to increase heading toward the anode electrode 11. Specifically, in order to effectively perform this embodiment, it is crucial to set the surface impurity concentration (or maximum concentration) of the semiconductor region 30 to under $3\times10^{17}$ $cm^{-3}$, and to set the surface impurity concentration (or maximum concentration) of the semiconductor region 31 to $3\times10^{17}$ $cm^{-3}$ and over.

Furthermore, the "impurity concentration" described above refers to an effective concentration of impurity elements contributing to conductivity of a semiconductor material. For example, when the impurity element that becomes a donor and the impurity element that becomes an acceptor are included in the semiconductor material, a concentration other than the offset amount of the donor and the acceptor is defined as the impurity concentration among the activated impurity elements.

Furthermore, in the present embodiment, unless otherwise specified, the concentration of the n-type impurity elements is represented as decreasing in order of the $n^+$-type and then the n-type. Moreover, the concentration of the p-type impurity elements is represented as decreasing in order of the $p^+$-type and then the p-type. Furthermore, in the semiconductor device 1A, the same effect can be achieved by making each $p^+$-type and p-type an $n^+$-type or n-type.

Furthermore, in this embodiment, unless otherwise specified, the impurity concentration of the $n^+$-type semiconductor region being higher than the impurity concentration of the n-type semiconductor region also includes a situation where the impurity concentration of the $n^+$-type semiconductor region on a surface of the $n^+$-type semiconductor region that contacts the cathode electrode 10 is higher than the impurity concentration of the n-type semiconductor region. Moreover, in this embodiment, the impurity concentration of the $p^+$-type semiconductor region being higher than the impurity concentration of the p-type semiconductor region also includes a situation where the impurity concentration of the $p^+$-type semiconductor region on a surface of the $p^+$-type semiconductor region that contacts the anode electrode 11 is higher than the impurity concentration of the p-type semiconductor region on a surface of the p-type semiconductor region that contacts the anode electrode 11.

A material of the cathode electrode 10 and a material of the anode electrode 11 is, for example, a metal that includes at least one element selected from a group of aluminum (Al), titanium (Ti), nickel (Ni), tungsten (W), gold (Au), and the like.

The connection region 11a includes, for example, polysilicon. The material of the connection region 11a is not limited to polysilicon and may be the same material as that of the anode electrode 11.

Variation of the First Embodiment

Figure 5A:
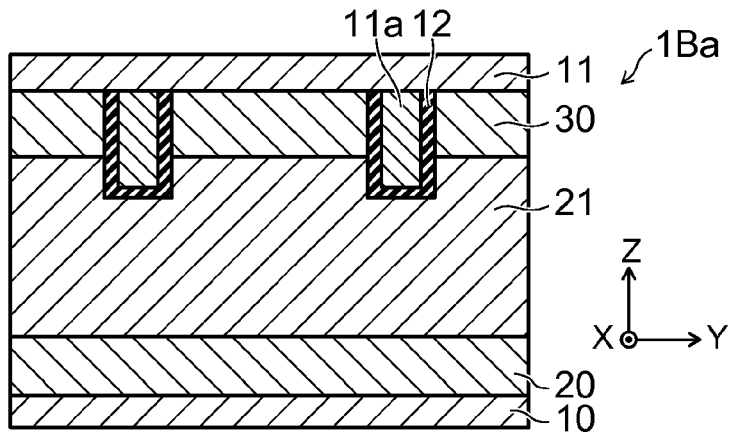
FIG. 5A and FIG. 5B are schematic cross-sectional views of a semiconductor device according to a first variation of the first embodiment.
Figure 5B:
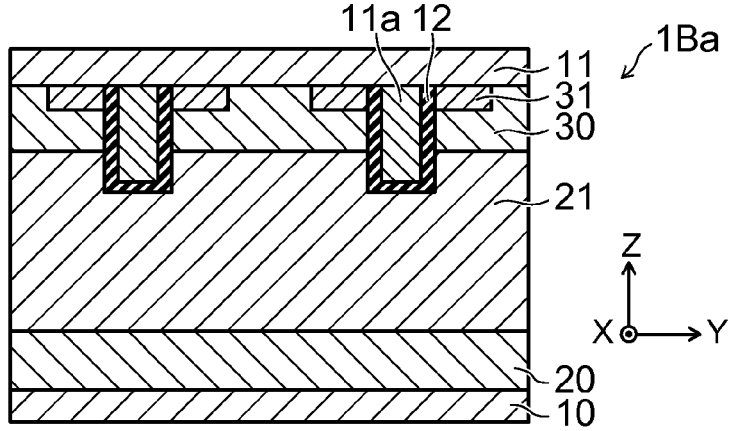
Figure 5C:
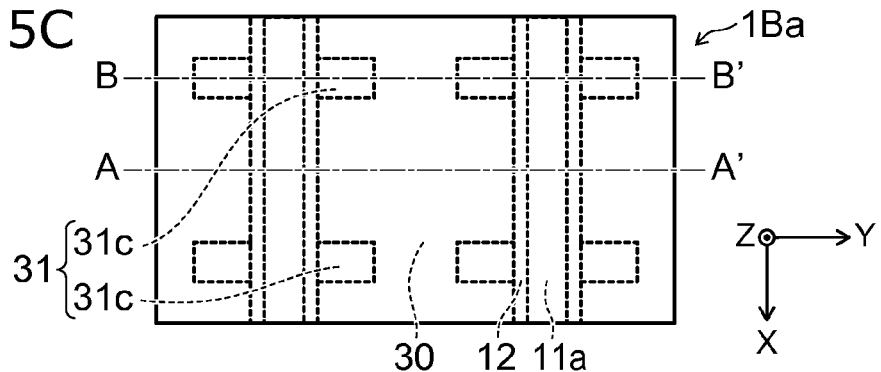
FIG. 5C is a schematic plan view of the same device.
Figure 5D:
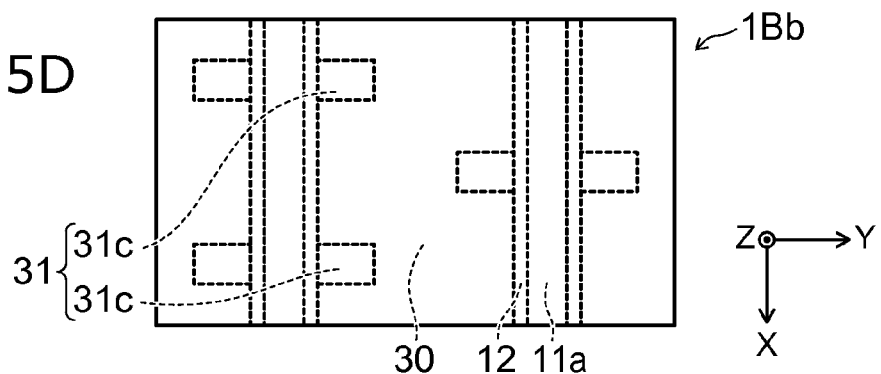
FIG. 5D is a schematic plan view of yet another semiconductor device of the first variation.

FIG. 5A and FIG. 5B are schematic cross-sectional views of a semiconductor device according to a first variation of the first embodiment, FIG. 5C is a schematic plan view of the same device, and FIG. 5D is a schematic plan view of yet another semiconductor device of the first variation.

An A-A' cross-section of FIG. 5C is represented in FIG. 5A, and a B-B' cross-section of FIG. 5C is represented in FIG. 5.

With a semiconductor device 1Ba, the connection region 11a and the insulating layer 12 extend, for example, in the X-direction. The semiconductor region 31 is split into a plurality of regions 31c. Each of the plurality of regions 31c is lined up, for example, in the X-direction. Each of the plurality of semiconductor regions 31 contacts the insulating layer 12.

The same results of action are provided with the semiconductor device 1Ba as the semiconductor device 1A. In addition, the contact area of the semiconductor region 31 and the anode electrode 11 decreases in the semiconductor device 1Ba when compared to the semiconductor device 1A. Thereby, in the semiconductor device 1Ba, the injection amount of the holes from the anode side is further suppressed, and the recovery speed thereof is sped up further.

In addition, regarding the cycle of the semiconductor region 31 (region 31c) lined up in the X-direction, it is not necessary to dispose all of them in the same phase, and the phases may be shifted as a semiconductor device 1Bb illustrated in FIG. 5.

Second Variation of the First Embodiment

Figure 6A:
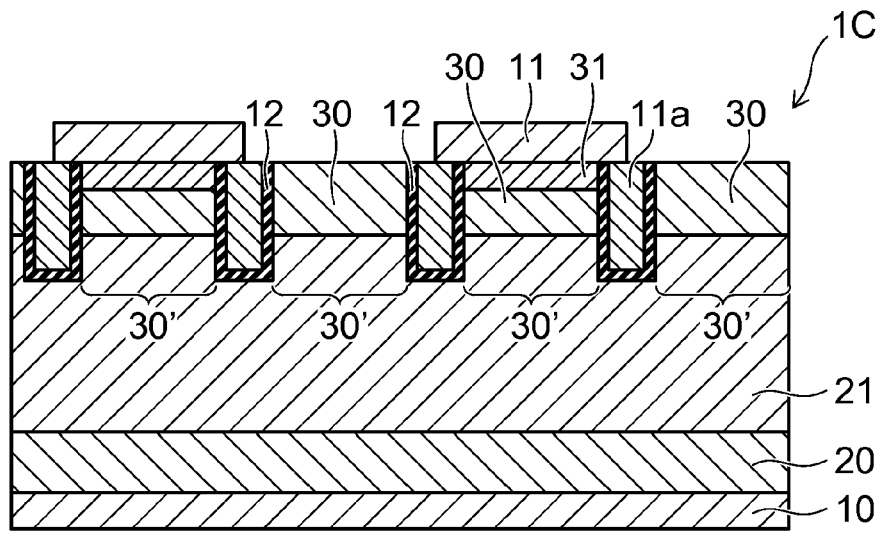
FIG. 6A and FIG. 6B are schematic cross-sectional views of the semiconductor device according to a second variation of the first embodiment.
Figure 6B:
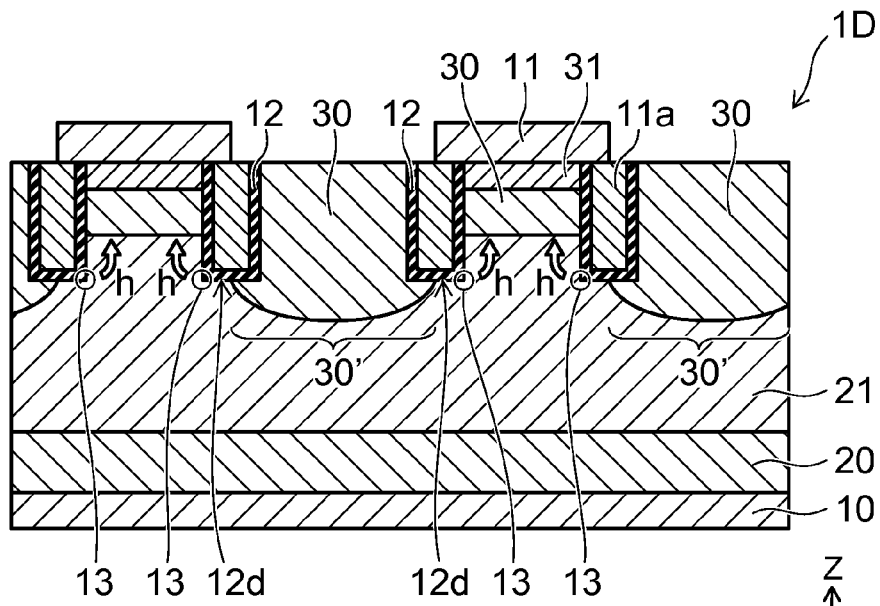

FIG. 6A and FIG. 6B are schematic cross-sectional views of the semiconductor device according to a second variation of the first embodiment.

With the semiconductor device 1C illustrated in FIG. 6A, the semiconductor region 31 is sandwiched by a pair of the connection regions 11a, and a region 30' sandwiched by the adjacent regions 11a is separated into a region with the semiconductor region 31 provided and a region with no semiconductor region 31 provided.

The same results of action are provided with the semiconductor device 1C as the semiconductor device 1A. In addition, in the semiconductor device 1A, the contact area of the semiconductor region 31 and the anode electrode 11 decreases when compared to the semiconductor device 1A because there is a region where the semiconductor region 31 is not provided. Thereby, in the semiconductor device 1C, the injection amount of holes from the anode side is further suppressed, and the recovery speed thereof is sped up further.

Furthermore, with a semiconductor device 1D illustrated in FIG. 6B, the semiconductor region 30 of the region 30' without the semiconductor region 30 provided covers a portion of a lower end 12d of the insulating layer 12. Thereby, the avalanche during recovery occurs with priority on a side of the corner portion 13 with the semiconductor region 31 provided. Then, the avalanche current is discharged to the anode electrode 11 via the corner portion 13 on an upper part of the semiconductor region 31. Thereby, a breakdown resistance increases in the semiconductor device 1D when compared to the semiconductor device 1A.

Third Variation of the First Embodiment

A structure where the semiconductor region 31 is provided on one of the two sides of the connection region 11a and not provided on the other side, is not limited to the structure described above.

Figure 7:
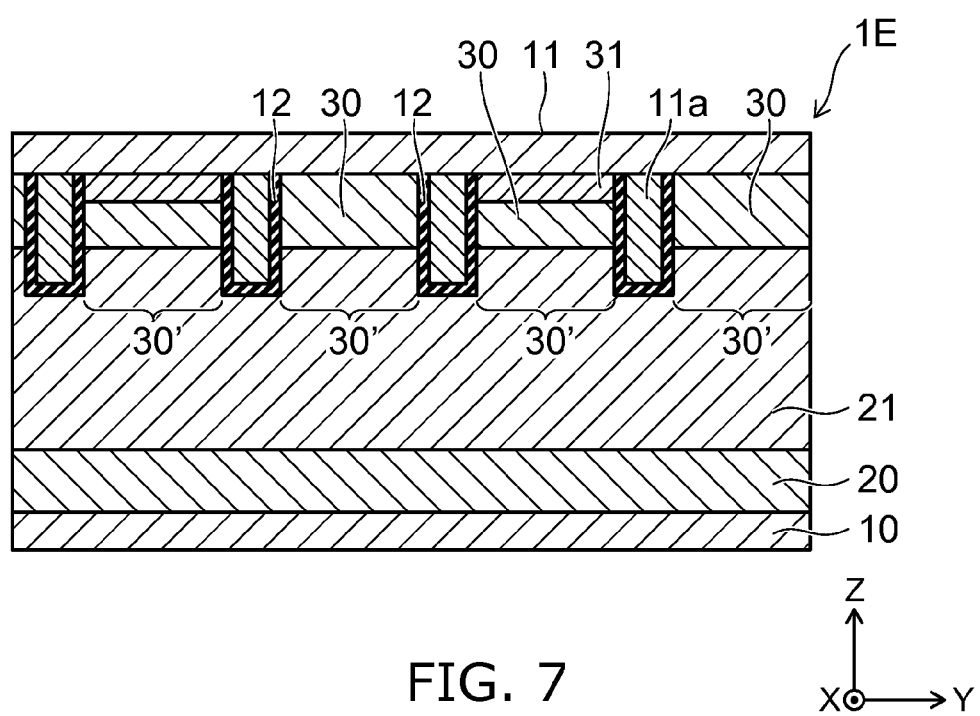
FIG. 7 is a schematic cross-sectional view of a semiconductor device according to a third variation of the first embodiment.

FIG. 7 is a schematic cross-sectional view of a semiconductor device according to a third variation of the first embodiment.

In the semiconductor device 1E, a region with a semiconductor region 31 provided and a region with no semiconductor region 31 provided are alternately arrayed in the Y-direction. In addition, the anode electrode 11 is disposed on both regions.

Even in this structure, the injection amount of holes is further suppressed. Thereby, the recovery speed of the semiconductor device is sped up further.

Second Embodiment

Figure 8:
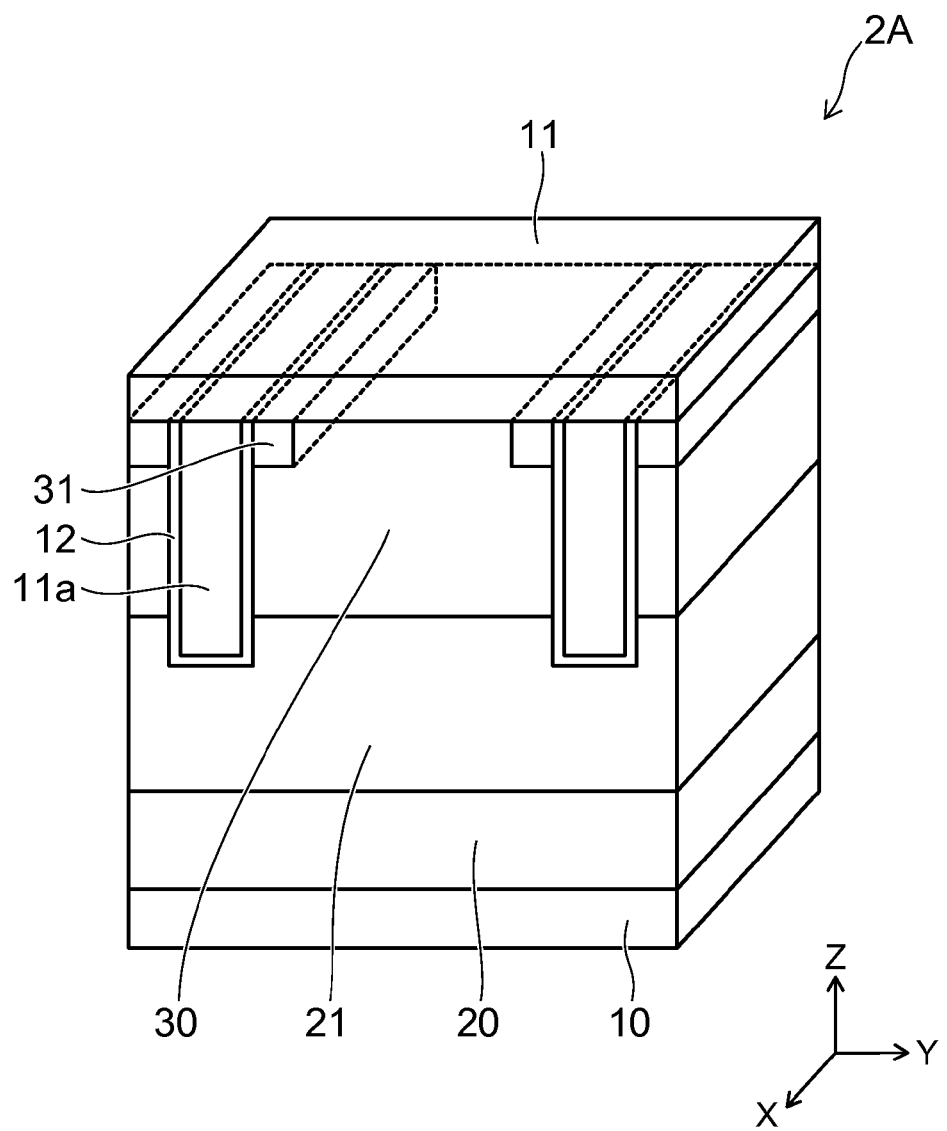
FIG. 8 is a schematic three-dimensional view of a semiconductor device according to a second embodiment.

FIG. 8 is a schematic three-dimensional view of a semiconductor device according to a second embodiment.

Figure 9A:
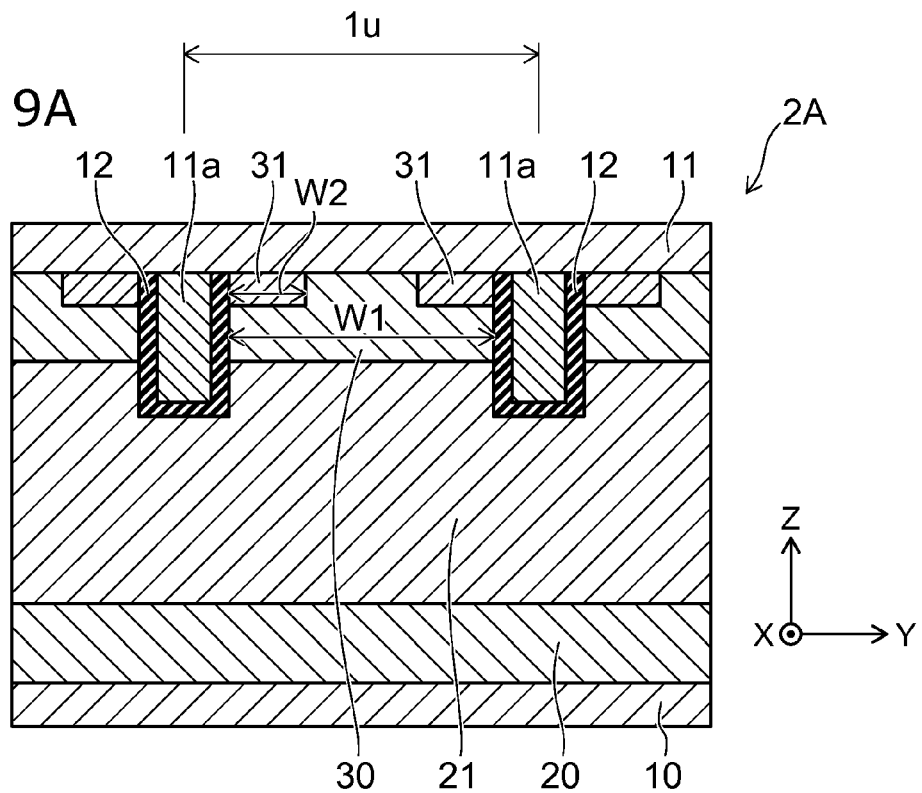
FIG. 9A is a schematic cross-sectional view of the semiconductor device according to the second embodiment, and the FIG. 9B is a schematic plan view of the semiconductor device according to the second embodiment.
Figure 9B:
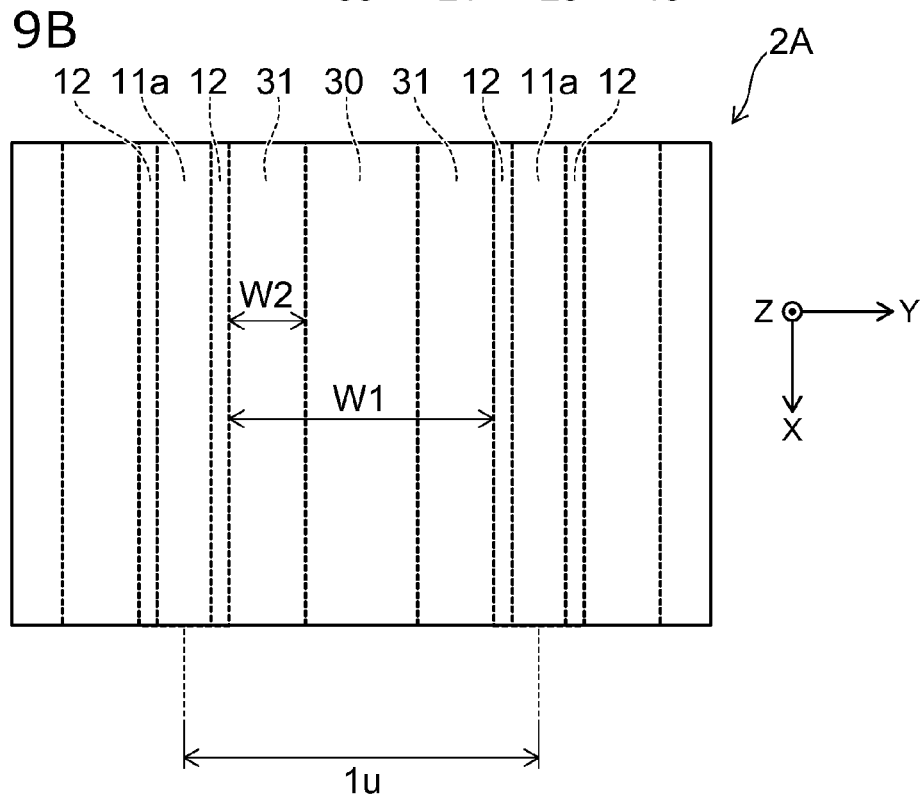

FIG. 9A is a schematic cross-sectional view of the semiconductor device according to the second embodiment, and the FIG. 9B a schematic plan view of the semiconductor device according to the second embodiment.

A semiconductor device 2A according to the second embodiment is generally a type of p-intrinsic-n (PIN) diode. The semiconductor device 2A is used, for example, as a refluxing diode such as an inverter circuit. The range 1u illustrated in FIGS. 9A and 9B is a range of a smallest unit of the semiconductor device 2A. The semiconductor device 2A uses the smallest unit to exhibit an action effect that will be described below. A portion different from the first embodiment, which has the same code in the same or a similar location as the embodiment.

In the first embodiment a structure is shown where the semiconductor region 31 is disposed thinned out in the X-direction, and the second embodiment does not have this structure, but the semiconductor region 31 extends in the X-direction. However, the semiconductor region 30 comes in Schottky contact with the anode electrode 11.

For example, the semiconductor region 30 is provided between the semiconductor layer 21 and the anode electrode 11. The semiconductor region 30 contacts the anode electrode 11 and the semiconductor layer 20. With the semiconductor region 30, the surface of low concentration contacts the anode electrode 11. Here, a characteristic is that the semiconductor region 30 comes in Schottky contact with the anode electrode 11. A film thickness of the semiconductor region 30 is, for example, 0.5 μm (micrometers) to 10 μm.

The semiconductor region 31 is provided between the semiconductor region 30 and the anode electrode 11. The semiconductor region 31 continuously extends in the X-direction. The semiconductor region 31 contacts the semiconductor region 30, the anode electrode 11, and the insulating layer 12. In other words, portions other than where the semiconductor region 31 contacts the anode electrode 11 and the insulating layer 12, contact the semiconductor region 30. The impurity concentration of the semiconductor region 31 is higher than the impurity concentration of the semiconductor region 30. The semiconductor region 31 is in ohmic contact with the anode electrode 11. A film thickness of the semiconductor region 31 is, for example, 0.1 µm to 5 µm.

For example, a concentration of impurity elements included in the semiconductor region 31 on a surface where the semiconductor region 31 contacts the anode electrode 11 is higher than a concentration of impurity elements included in the semiconductor region 30 on a surface where the semiconductor region 30 contacts the anode electrode 11.

The connection region 11a contacts the anode electrode 11a. The connection region 11a extends from the anode electrode 11 toward the cathode electrode 10, and reaches the semiconductor layer 21. The insulating layer 12 is provided between the connection region 11a and the semiconductor layer 21 and between the connection region 11a and the semiconductor regions 30 and 31.

The connection region 11a, the insulating layer 12, and the semiconductor region 31 extend in a direction (for example, the X-direction) crossing a direction (for example, the Z-direction) from the cathode electrode 10 to the anode electrode 11 (FIG. 9B). In other words, the connection region 11a extends in the X-direction with the semiconductor region 31 without crossing the semiconductor region 31. The connection region 11a and the insulating layer 12 are arrayed in a direction (for example, the Y-direction) crossing a direction (for example, the Z-direction) from the cathode electrode 10 to the anode electrode 11.

The distance (1 pitch) between the center of the connection region 11a and the center of a connection region 11a adjacent to this connection region 11a is, for example, 1 µm to 6 µm.

An operation of the semiconductor device 2A will be describe.

Figure 10A:
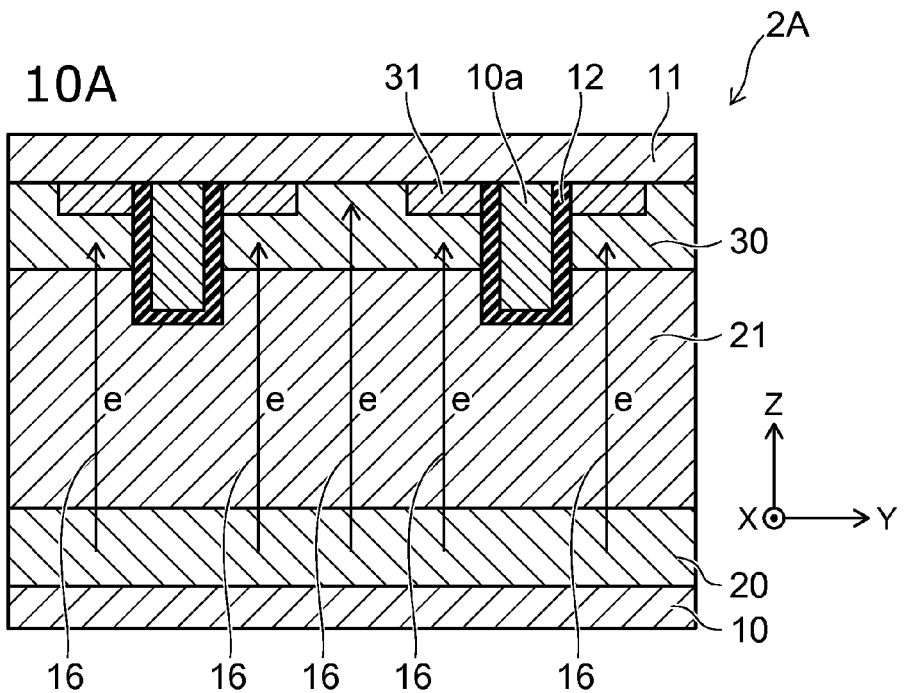
FIG. 10A and FIG. 10B are schematic cross-sectional views illustrating an ON operation of the semiconductor device according to the second embodiment.
Figure 10B:
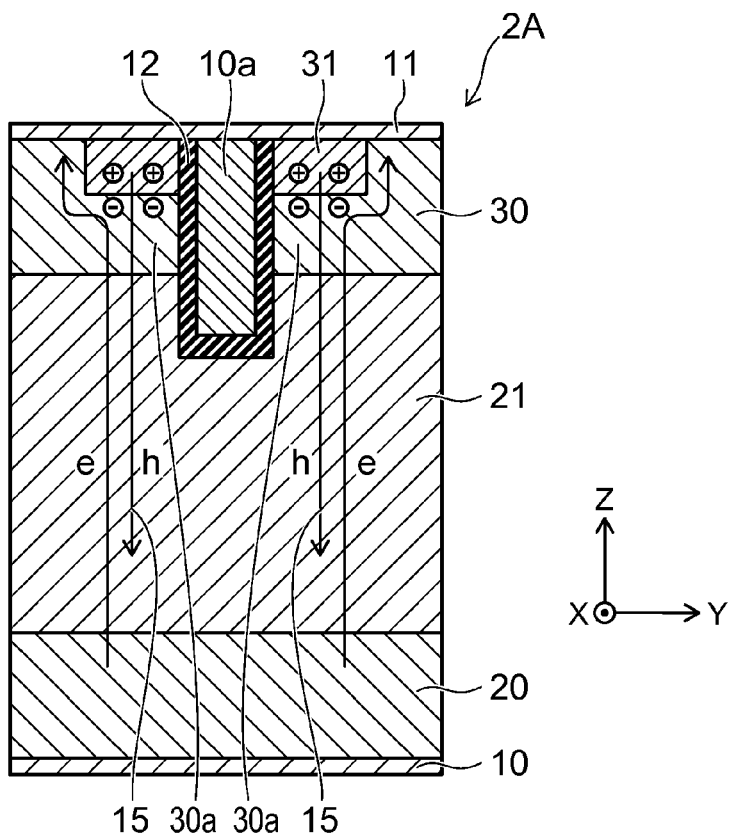

FIG. 10A and FIG. 10B are schematic cross-sectional views illustrating an ON operation of the semiconductor device according to the second embodiment.

First, an electron current flowing from a cathode side to an anode side will be described using FIG. 10A. When ON state, forward bias voltage is applied between the cathode and the anode. In other words, voltage is applied between the cathode and the anode so that the potential of the anode electrode 11 is higher than the potential of the cathode electrode 10. For example, the anode electrode 11 is a positive electrode, and the cathode electrode 10 is a negative electrode.

Here, the semiconductor layer 20 is in ohmic contact with the cathode electrode 10. Therefore, electrons (e) reach the semiconductor region 30 from the semiconductor layer 20 via the semiconductor layer 21.

The semiconductor region 30 is in Schottky contact with the anode electrode 11. In other words, this contact is a Schottky contact by a p-type semiconductor and a metal. Therefore, a junction between the semiconductor region 30 and the anode electrode 11 becomes an energy barrier for holes (h), but not an energy barrier for the electrons (e).

Therefore, the electrons (e) flow to the anode electrode 11 from the semiconductor layer 20 via the semiconductor layer 21 and the semiconductor region 30. Thereby, an electron current 16 is formed between the cathode and the anode.

Next, a hole current flowing from the anode side to the cathode side will be described using FIG. 10B. A junction between the semiconductor region 30 and the anode electrode 11 does not become an energy barrier for the electrons (e). However, a junction between the semiconductor region 31 which is a p-type high concentration layer and the semiconductor region 30 which is a p-type low concentration layer becomes an energy barrier for the electrons (e). Therefore, it becomes hard for the electrons (e) which flow to the semiconductor region 30 directly below the semiconductor region 31 to flow to the semiconductor region 31.

Thereby, the electrons (e) reach the vicinity of the semiconductor region 31 after flowing in the direction from the cathode side to the anode side and afterwards move in a direction substantially parallel to a lateral direction, in other words, the Y-direction, on the lower part of the semiconductor region 31.

Through this movement of the electrons (e), the semiconductor region 31 contacting the anode electrode 11 becomes a positive electrode, and a portion 30a positioned on the lower part of the semiconductor region 31 is biased so as to become a negative electrode with respect to the semiconductor region 31.

The bias formed between the portion 30a and the anode electrode 11 lowers the energy barrier against the holes between the semiconductor region 30 and the semiconductor region 31 on the lower part of the semiconductor region 31. Thereby, the holes (h) are injected from the semiconductor region 31 to the semiconductor region 30. A hole current 15 is formed by these injected holes (h).

The greater the width in the Y-direction of the semiconductor region 31, or the greater the contact area of the semiconductor region 31 and the anode electrode 11 is, the more the hole current 15 increases. In other words, the injection amount of holes from the anode side is adjusted according to the width or the contact area.

Note that when ON state, a forward bias is applied between the semiconductor region 30 and the semiconductor layer 21. Therefore, it is self-evident that holes and electrons flow between pn junctions.

In this manner, when ON state, holes flow from the anode side to the cathode side, and electrons flow from the cathode side to the anode side. Here, with the anode side, there is no injection of holes compared to the injection of holes from the semiconductor region 31, and because the semiconductor region 30 is in Schottky contact with the anode electrode 11, the semiconductor region 30 contributes only to electron discharge. Therefore, the injection amount of holes is suppressed when compared to a semiconductor device that has no semiconductor region 30 provided. Thereby, recovery speed can be sped up in the semiconductor device 2A. In this manner, it is characteristic in the second embodiment that the semiconductor region 30 comes in Schottky contact with the anode electrode 11, and low injection amount can be achieved in this manner. In order to achieve this, it is necessary for the surface impurity concentration (or maximum value) of the semiconductor region 30 to be $3 \times 10^{17}$ cm$^{-3}$ or lower.

The recovery operation of the semiconductor device according to the second embodiment is the same as with the semiconductor device according to the first embodiment and details regarding it will be omitted. However, breakdown resistance can be increased.

As described above, according to the semiconductor device 2A according to the second embodiment, speeding up the recovery speed and increasing the breakdown resistance during recovery, that is, enlarging the safe operation area, can be made compatible.

Furthermore, an impurity concentration distribution of the semiconductor regions 30 and 31 may be structured as described below.

Figure 11A:
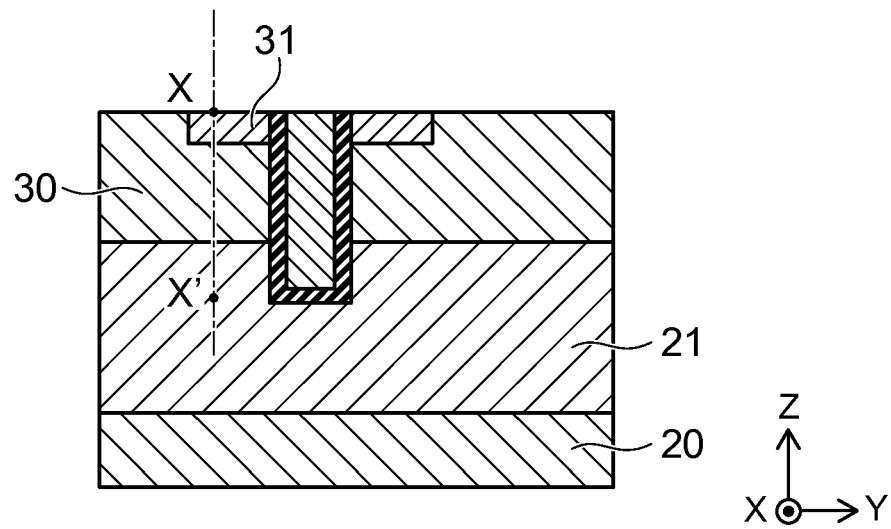
FIG. 11A is a schematic cross-sectional view of a semiconductor region according to the second embodiment.
Figure 11B:
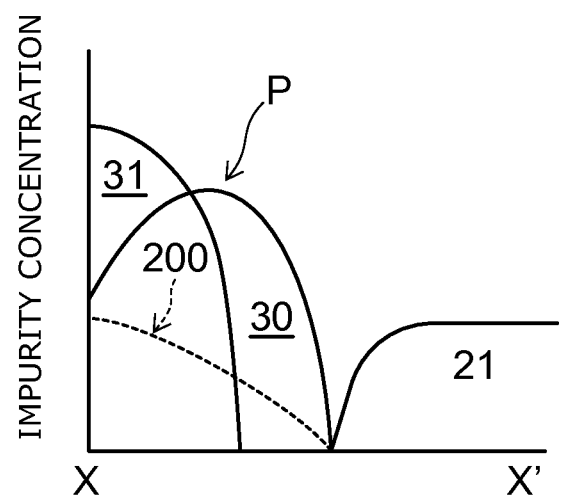
FIG. 11B is a graph showing an impurity concentration profile of the semiconductor region according to the second embodiment.

FIG. 11A is a schematic cross-sectional view of a semiconductor region according to the second embodiment, and FIG. 11B is a graph showing an impurity concentration profile of the semiconductor region according to the second embodiment.

FIG. 11B shows the impurity concentration profile on a position of an X-X' semiconductor region 30 illustrated in FIG. 11A. Furthermore, an impurity concentration profile 200 according to a reference example is represented in FIG. 11B.

As with the impurity concentration profile 200 of the reference example, when the impurity concentration in the semiconductor region 30 heads from the anode side to the cathode side and gradually gets lower, the depletion layer generated during recovery extends too far and there is a possibility that the depletion layer will reach the anode electrode 11 during recovery. In this case, there is a possibility that a so-called punch-through will occur, and the breakdown voltage of the semiconductor device deteriorates.

On the other hand, with the semiconductor device shown in FIG. 11B, the impurity concentration in the semiconductor region 30 is temporarily higher as it heads from the anode side to the cathode side, and afterwards gets gradually lower. In other words, the impurity concentration in the semiconductor region 30 has a peak value p in the semiconductor region 30. This peak is positioned between the anode electrode 11 and the semiconductor layer 21.

In this kind of structure when the semiconductor region 30 and the anode electrode 11 have a Schottky junction, the depletion layer generated during recovery is suppressed, it is more difficult for the punch-through described above to occur. As a result, the breakdown voltage of the semiconductor device is kept.

Note that the position of the peak value p may be in a position deeper than the semiconductor region 31 and may be in the semiconductor region 32.

Note that the concentration distribution illustrated in FIGS. 11A and 11B is not limited to the semiconductor device 2A, and can be put to use as the semiconductor device disclosed herein.

Reference Example

Figure 12:
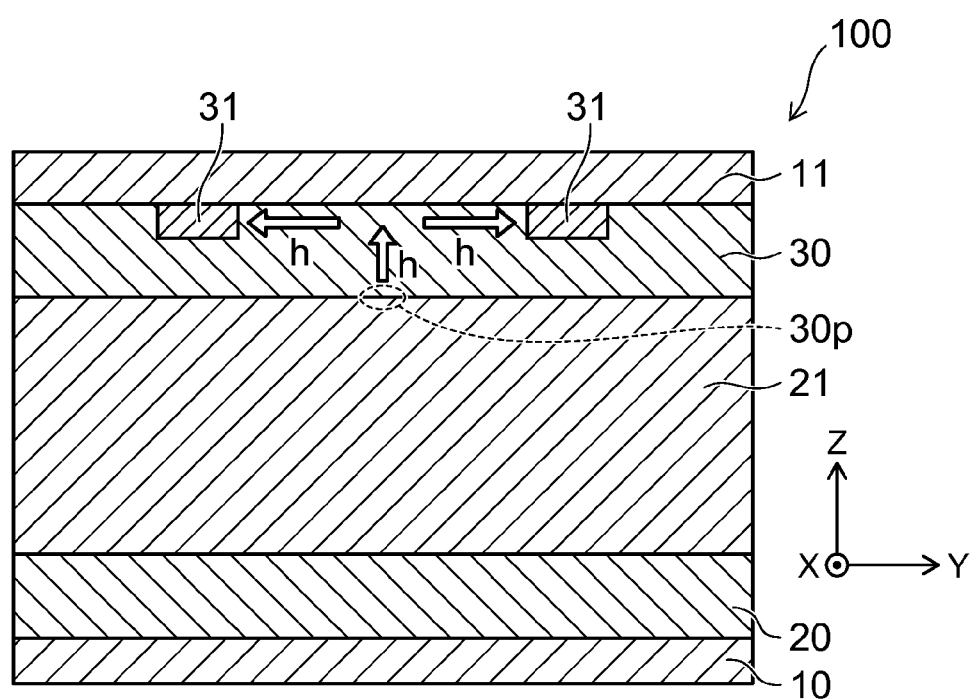
FIG. 12 is a schematic cross-sectional view representing a recovery operation of the semiconductor device according to a reference example.

FIG. 12 is a schematic cross-sectional view representing a recovery operation of the semiconductor device according to a reference example.

With the semiconductor device 100 according to the reference example, the semiconductor regions 30 and 31 are provided on the anode side. However, the connection region 11a and the insulating layer 12 are not provided in the semiconductor device 100.

Even in the semiconductor device 100, the injection amount of holes is suppressed from the anode side because the low concentration semiconductor device 30 is provided on the anode side. However, there are times during recovery when electric field concentration occurs in one of the pn junctions of the semiconductor region 30 and the semiconductor layer 21. In locations where electric field concentration occurs, an avalanche may also occur.

As one example, in FIG. 12, an example is illustrated where an avalanche occurs in a location 30p between the adjacent semiconductor regions 31. With this kind of location 30p, when avalanche is induced once, the avalanche continues with priority in the location 30p, and large avalanche current occurs from the location 30p.

With the semiconductor device 100, the semiconductor region 31 is not provided on the upper part of the location 30p. Further, because the semiconductor region 30 has low concentration, the semiconductor region 30 has a high resistance contact or a Schottky contact with the anode electrode 11. Because of this, it becomes difficult for avalanche current to be discharged to the anode electrode 11 in the semiconductor device 100 compared to the semiconductor device 1A.

Avalanche current generated in the location 30p flows into the semiconductor region 31 via an area near the interface of the semiconductor region 30 and the anode electrode 11 because there is a high resistance contact of a Schottky contact between the semiconductor region 30 and the anode electrode 11. Afterwards, the avalanche current is discharged to the anode electrode 11. A bias is applied between the semiconductor region 30 and the anode electrode 11 by the movement of the avalanche current, and the breakdown resistance of the semiconductor device 100 is deteriorated.

In this manner, breakdown resistance during recovery does not increase in the semiconductor device 100 compared to the semiconductor device 1A.

Further, in the semiconductor device 100, in order to lower hole injection from the anode side, a tolerance deterioration occurs during recovery when the impurity concentration of the semiconductor region 30 is becomes too low. Because of this, a limit occurs in the low concentration of the semiconductor region 30. This is to make current concentration occur easier in only one portion of the semiconductor region 30 during recovery.

Variations of the semiconductor device according to the second embodiment will be described.

The semiconductor device described below is provided with the cathode electrode 10, the anode electrode 11, the semiconductor layer 20, the semiconductor layer 21, the semiconductor region 30, the semiconductor region 31, the connection region 11a, and the insulating layer 12. Each varied location will be described.

First Variation of the Second Embodiment

FIG. 13A and FIG. 13B are schematic cross-sectional views of a semiconductor device according to a first variation of the second embodiment, and FIG. 13C is a schematic plan view of the same device.

An A-A' cross-section of FIG. 13C is represented in FIG. 13A, and a B-B' cross-section of FIG. 13C is represented in FIG. 13B.

With a semiconductor device 2B, the connection region 11a and the insulating layer 12 extend, for example, in the X-direction. The semiconductor region 31 has, for example, a region 31a (first region) that extends in the X-direction and a region 31b that extends in, for example, the Y-direction that crosses the X-direction (second region). When viewing the semiconductor region 31 from the Z-direction, it is ladder-shaped. The semiconductor region 31 contacts the insulating layer 12.

Even in the semiconductor device 2B, the same results of action are provided as the semiconductor device 2A because the semiconductor regions 30 and 31 are provided. In addition, the contact area of the semiconductor region 31 and the anode electrode 11 increases in the semiconductor device 2B compared to the semiconductor device 2A. Because of this, avalanche current is more effectively released to the anode electrode 11 during recovery, and breakdown resistance during recovery further increases.

Second Variation of the Second Embodiment

Figure 14A:
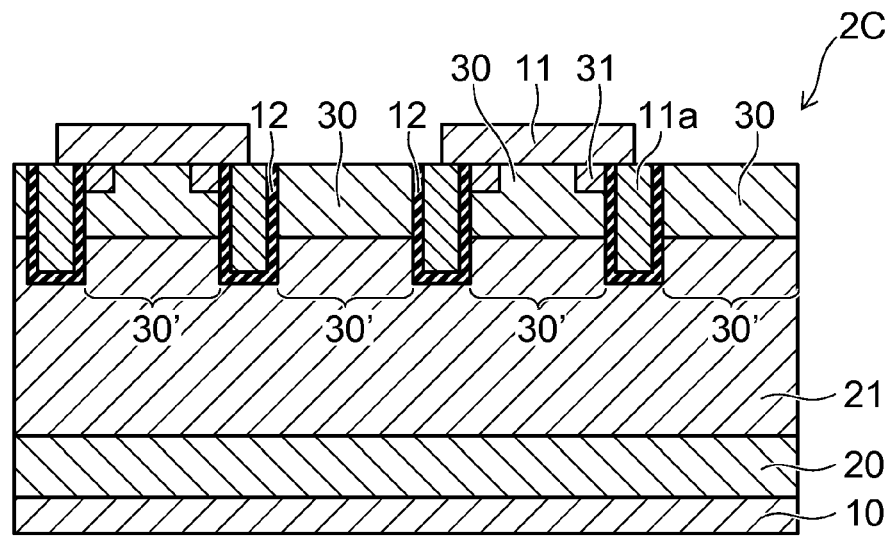
FIG. 14A and FIG. 14B are schematic cross-sectional views of the semiconductor device according to a second variation of the second embodiment.
Figure 14B:
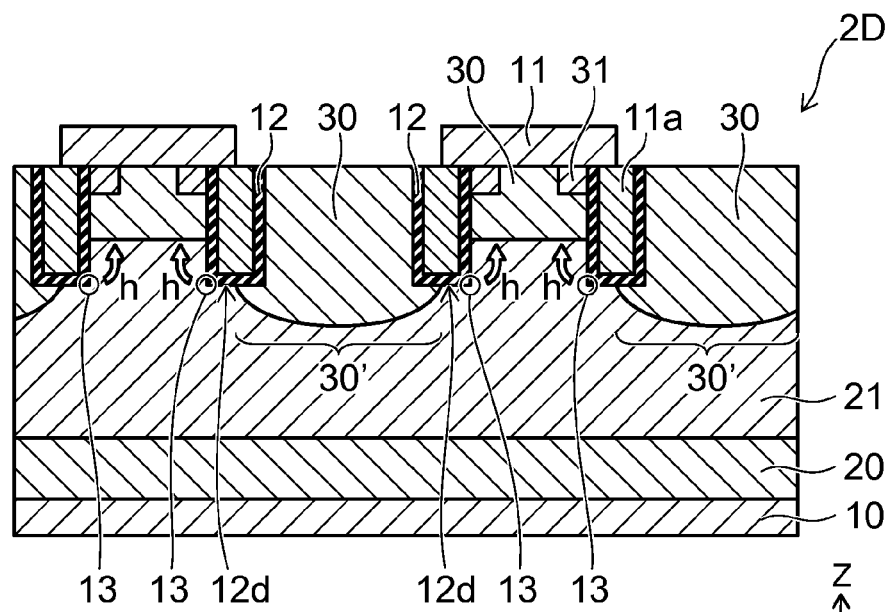

FIG. 14A and FIG. 14B are schematic cross-sectional views of the semiconductor device according to a second variation of the second embodiment.

In a semiconductor device 2C illustrated in FIG. 14A, the semiconductor region 31 is provided on one side of the connection region 11a, and is not provided on the other side. Therefore, a region 30' sandwiched by the adjacent connection regions 11a is separated in the semiconductor device 2C into a region where the semiconductor region 31 is provided and a region where the semiconductor region 31 is not provided.

The same results of action are provided with the semiconductor device 2C as the semiconductor device 2A. In addition, in the semiconductor device 2C, the contact area of the semiconductor region 31 and the anode electrode 11 decreases when compared to the semiconductor device 2A because there is a region where the semiconductor region 31 is not provided. Thereby, in the semiconductor device 2C, the injection amount of holes from the anode side is further suppressed, and the recovery speed thereof is sped up further.

Furthermore, with a semiconductor device 2D illustrated in FIG. 14B, the semiconductor region 30 of the region 30' without the semiconductor region 31 provided covers a portion of a lower end 12d of the insulating layer 12. Thereby, the avalanche during recovery occurs with priority on a side of the corner portion 13 with the semiconductor region 31 provided. Then, the avalanche current is discharged to the anode electrode 11 via the corner portion 13 on an upper part of the semiconductor region 31. Thereby, a breakdown resistance increases in the semiconductor device 2D when compared to the semiconductor device 2A.

Third Variation of the Second Embodiment

A structure where the semiconductor region 31 is provided on one of the two sides of the connection region 11a and not provided on the other side, is not limited to the structure described above.

Figure 15:
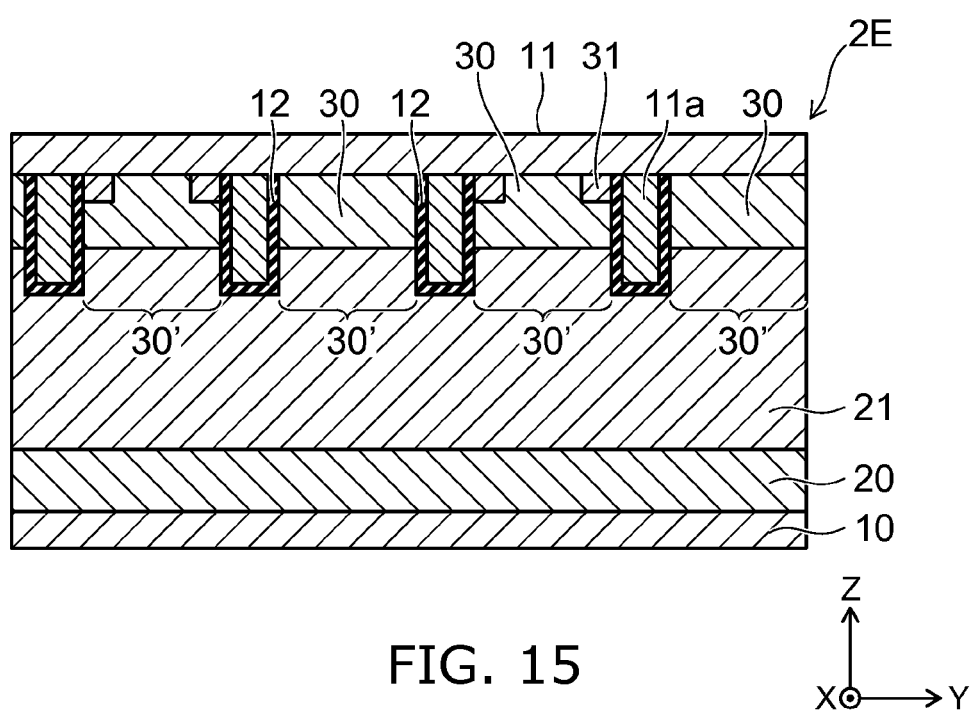
FIG. 15 is a schematic cross-sectional view of a semiconductor device according to a third variation of the first embodiment.

FIG. 15 is a schematic cross-sectional view of a semiconductor device according to a third variation of the first embodiment.

With a semiconductor device 2E, on the semiconductor region 30 sandwiched between the adjacent connection regions 11a, a region where the semiconductor region 31 is provided and a region where the semiconductor region 31 is not provided are alternately arranged. Further, the anode electrode 11 is disposed on both regions.

Even in this structure, the injection amount of holes is further suppressed. Thereby, the recovery speed of the semiconductor device is sped up further.

Third Embodiment

Figure 16A:
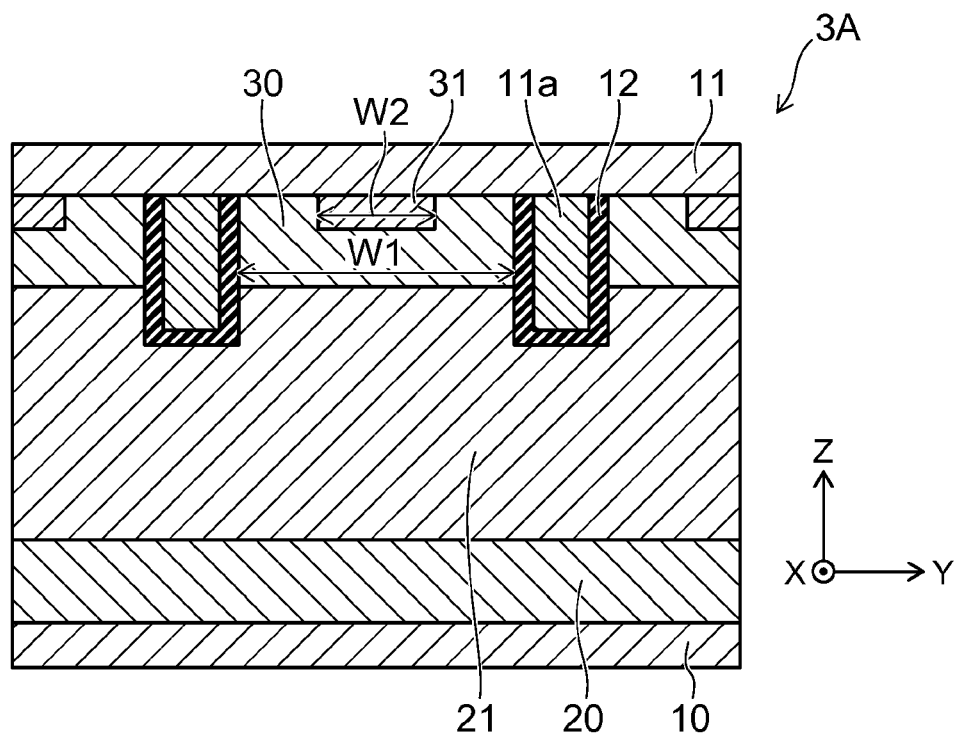
FIG. 16A is a schematic cross-sectional view of the semiconductor device according to the third embodiment, and the FIG. 16B is a schematic plan view of the semiconductor device according to the third embodiment.
Figure 16B:
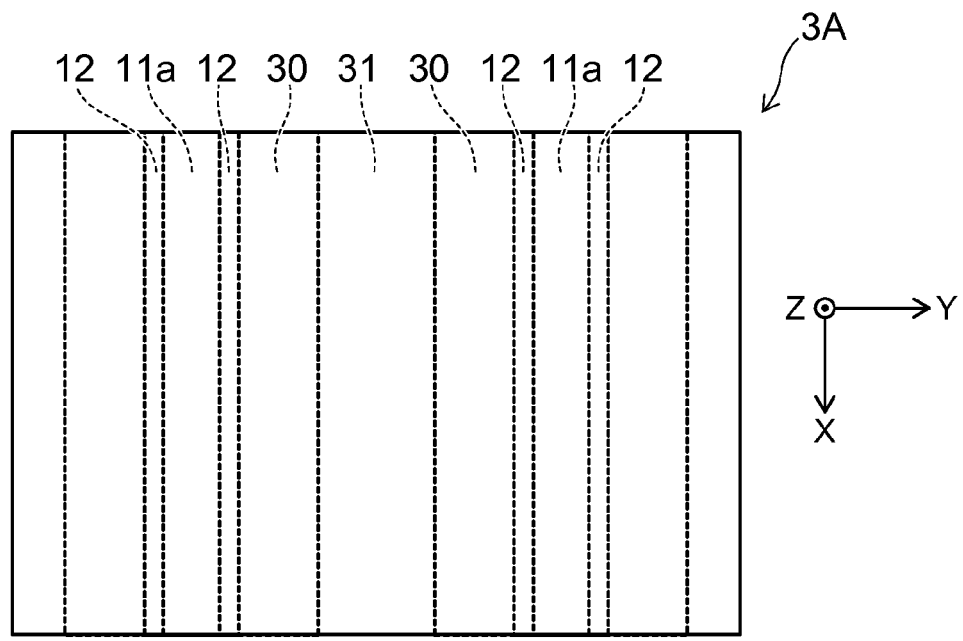

FIG. 16A is a schematic cross-sectional view of the semiconductor device according to the third embodiment, and the FIG. 16B a schematic plan view of the semiconductor device according to the third embodiment.

The high concentration semiconductor region 31 is not limited to contacting the insulating layer 12. For example, the semiconductor region 31 may be provided separated a predetermined distance from the insulating layer 12 in the Y-direction.

A semiconductor device 3A according to the third embodiment is provided with the cathode electrode 10, the anode electrode 11, the semiconductor layer 20, the semiconductor layer 21, the semiconductor region 30, the semiconductor region 31, the connection region 11a, and the insulating layer 12.

With the semiconductor device 3A, the impurity concentration (or maximum value) on a face where the semiconductor region 30 contacts the anode electrode 11 is under $3\times10^{17}$ cm$^{-3}$ (atoms/cm$^3$). The semiconductor region 30 is in Schottky contact with the anode electrode 11.

The semiconductor region 31 is provided between the semiconductor region 30 and the anode electrode 11. The semiconductor region 31 contacts the anode electrode 11. The impurity concentration (or the maximum value) on a face where the semiconductor region 31 contacts the anode electrode 11 is higher than $3\times10^{17}$ cm$^{-3}$, and for example, $1\times10^{19}$ cm$^{-3}$ or higher. (atoms/cm$^3$).

The impurity concentration of the semiconductor region 31 is higher than the impurity concentration of the semiconductor region 30. The semiconductor region 31 is in ohmic contact with the anode electrode 11. For example, a concentration of impurity elements included in the semiconductor region 31 on a surface where the semiconductor region 31 contacts the anode electrode 11 is higher than a concentration of impurity elements included in the semiconductor region 30 on a surface where the semiconductor region 30 contacts the anode electrode 11.

The insulating layer 12 is provided between the connection region 11a and the semiconductor layer 21 and between the connection region 11a and the semiconductor regions 30. The connection region 11a, the insulating layer 12, and the semiconductor region 31 extend in a direction (for example, the X-direction) crossing a direction (for example, the Z-direction) from the cathode electrode 10 to the anode electrode 11. The connection region 11a and the insulating layer 12 are arrayed in a direction (for example, the Y-direction) crossing a direction from the cathode electrode 10 to the anode electrode 11.

Even in this kind of semiconductor device 3A, the same results of action are provided as with the semiconductor device 2A. Furthermore, in the semiconductor device 3A, for example, in an example of the third embodiment, the contact area of the semiconductor region 31 and the anode electrode 11 decreases compared to the semiconductor device 2A, because one semiconductor region 31 is provided between the adjacent insulating layers 12. Thereby, in the semiconductor device 3A, the injection amount of the holes from the anode side is further suppressed, and the recovery speed thereof is sped up further.

Variation of the Third Embodiment

Figure 17A:
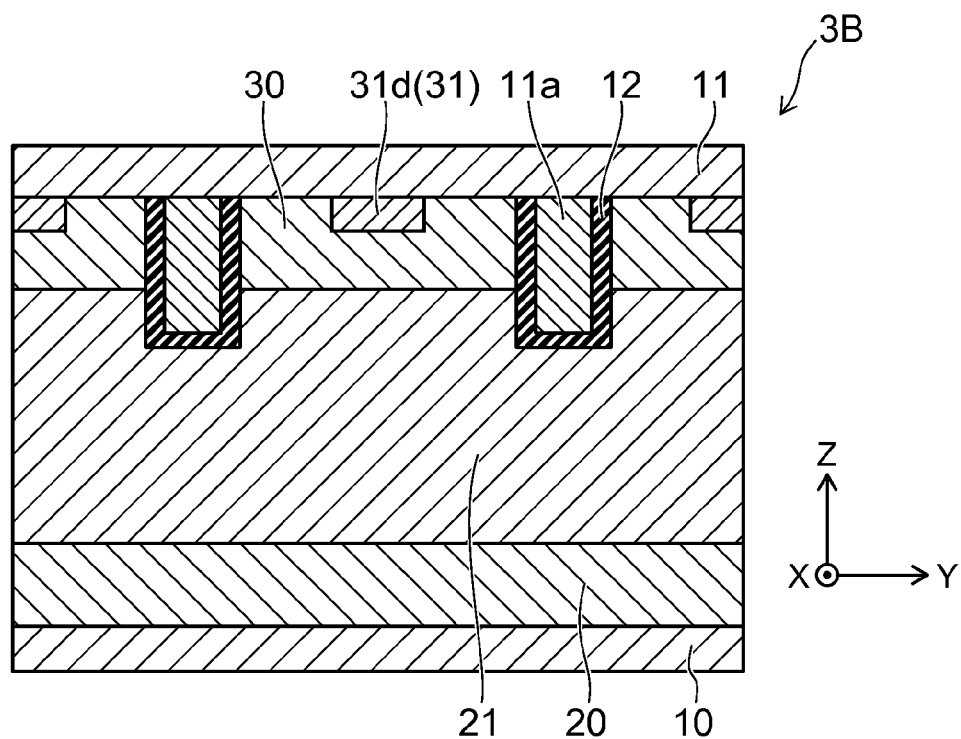
FIG. 17A is a schematic cross-sectional view of a semiconductor device according to a variation of the third embodiment.
Figure 17B:
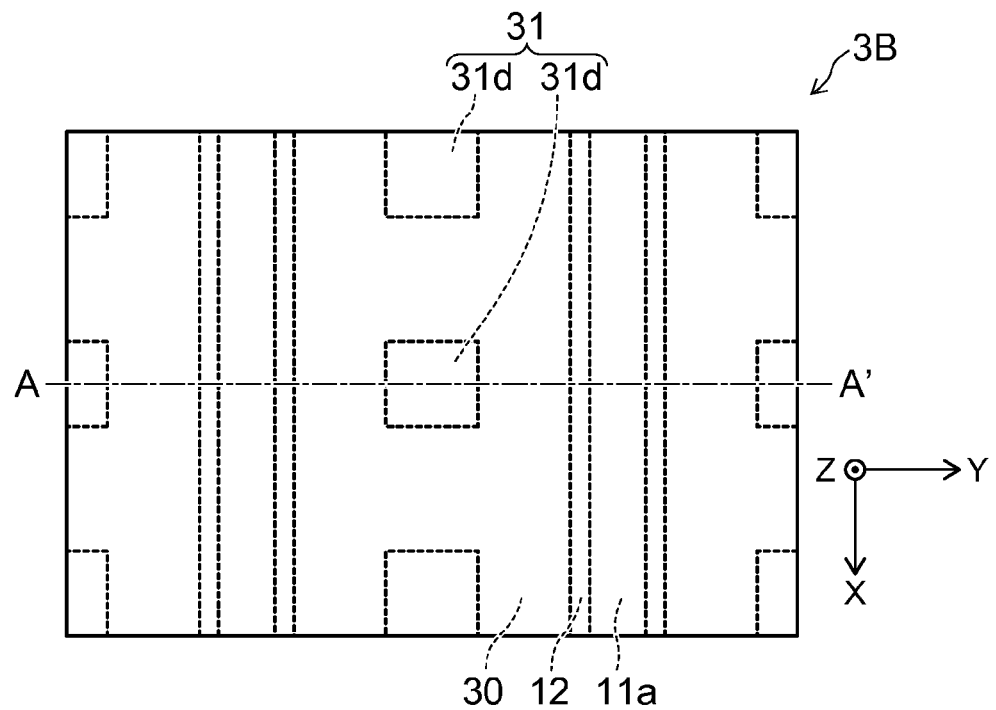
FIG. 17B is a schematic plan view of the semiconductor device according to a variation of the third embodiment.

FIG. 17A is a schematic cross-sectional view of a semiconductor device according to a variation of the third embodiment, and FIG. 17B is a schematic plan view of the semiconductor device according to a variation of the third embodiment.

The A-A' cross section of FIG. 17B is represented in FIG. 17A. With a semiconductor device 3B, the connection region 11a and the insulating layer 12 extend, for example, in the X-direction. Also, in the semiconductor device 3B, continuous semiconductor regions 31 are not provided in the X-direction, and the device is split into a plurality of regions 31d. Each of the plurality of regions 31c is lined up, for example, in the X-direction.

Even in this kind of semiconductor device 3B, the same results of action are provided as with the semiconductor device 3A. In addition, the contact area of the semiconductor region 31 and the anode electrode 11 decreases in the semiconductor device 3B when compared to the semiconductor device 3A. Thereby, the injection amount of the holes from the anode side is further suppressed in the semiconductor device 3B, and the recovery speed thereof is sped up further.

Note that it was found that with a structure as the variation that is deep and where the semiconductor region 31 is thinned, the semiconductor region 30 does not always have to come in Schottky contact with the anode electrode 11 because the injection amount of the holes can be sufficiently decreased. In this case, a surface impurity concentration (or the maximum value) of the semiconductor region 30 is, for example, less than $3 \times 10^{18}$ cm$^{-3}$. The surface impurity concentration (or the maximum value) of the semiconductor region 31 is $3 \times 10^{17}$ cm$^{-3}$ or greater, and, for example, $1 \times 10^{19}$ cm$^{-3}$ or greater. These impurity concentrations of the p-type semiconductor regions may be set to increase heading toward the anode electrode 11.

Fourth Embodiment

Figure 18:
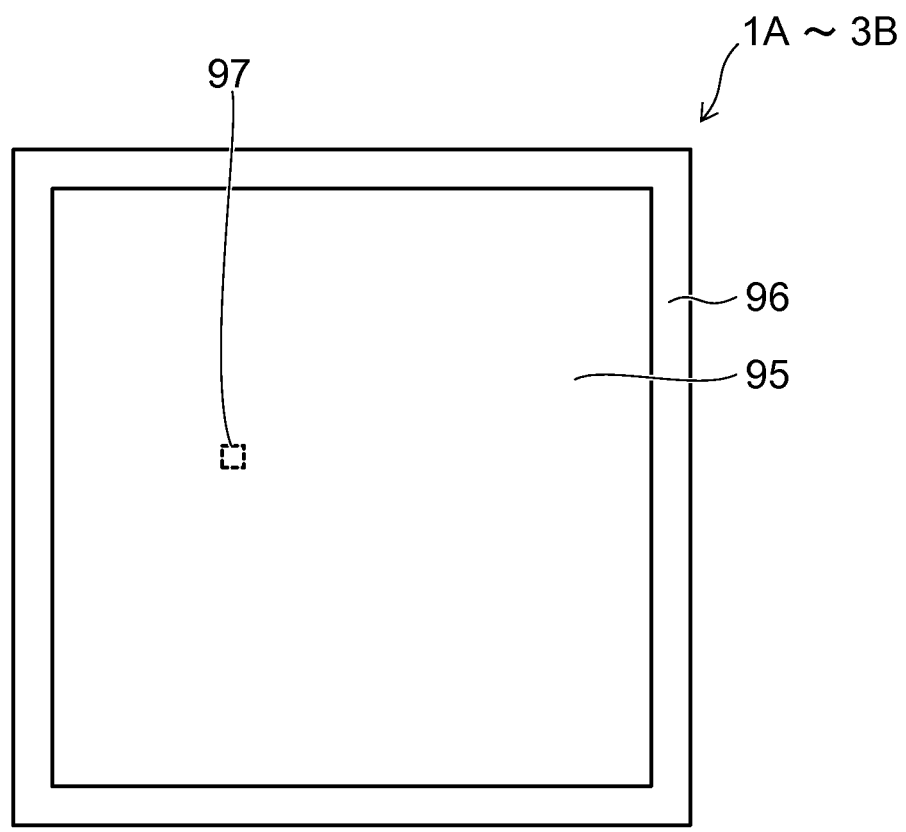
FIG. 18 is a schematic plan view of a semiconductor device according to a fourth embodiment.

FIG. 18 is a schematic plan view of a semiconductor device according to a fourth embodiment.

A schematic plan view of the semiconductor devices 1A to 3B which have become chip-shaped is represented in FIG. 18. Each of the semiconductor devices 1A to 3B is provided with an active region 95 and a peripheral region 96 surrounding the active region 95. Here, the active region 95 is a region wherein the semiconductor device can function as an element (diode).

For example, an occupancy of the semiconductor region 31 on any region 97 in the active region 95 is 30% or less, and more favorably 20% or less. Here, any region 97 is a region randomly selected from in the active region 95, and is, for example, a 100 μm angle. In the region 97, the semiconductor device can function as a diode exemplified in this embodiment.

The occupancy of this kind of semiconductor region 31 enables a fast recovery of the semiconductor devices 1A to 3B and a high breakdown resistance during recovery.

Note that when the semiconductor devices 20 and 21 are semiconductor substrates, forming the semiconductor devices 1A to 3B is not done through a wafer processing using these semiconductor substrates, but a metal oxide semiconductor field effect transistor (MOSFET), an insulated gate bipolar transistor (IGBT), and the like may be formed on the semiconductor substrates. Here, MOSFETs and IGBTs are so-called trench gate type transistors, and the trench gate included in the MOSFET, IGBT, or the like and the connection region 11a and the insulating layer 12 can be formed simultaneously. Therefore, costs do not rise even when introducing the connection region 11a and the insulating layer 12 into the semiconductor devices 1A to 3B.

Fifth Embodiment

The semiconductor devices 1A to 3B can be composite with the IGB.

Figure 19:
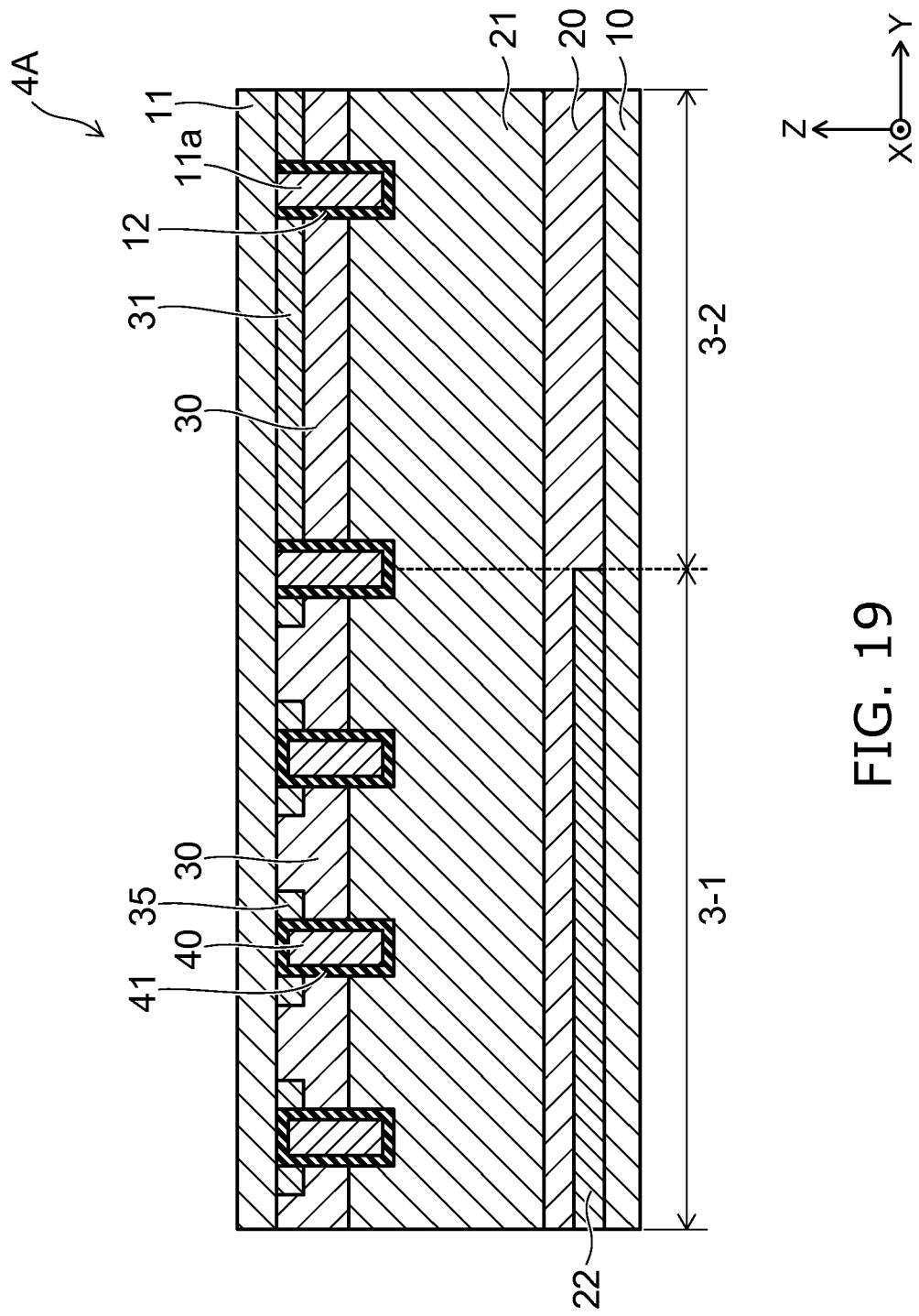
FIG. 19 is a schematic cross-sectional view of a semiconductor device according to a first example of the fifth embodiment.
Figure 20:
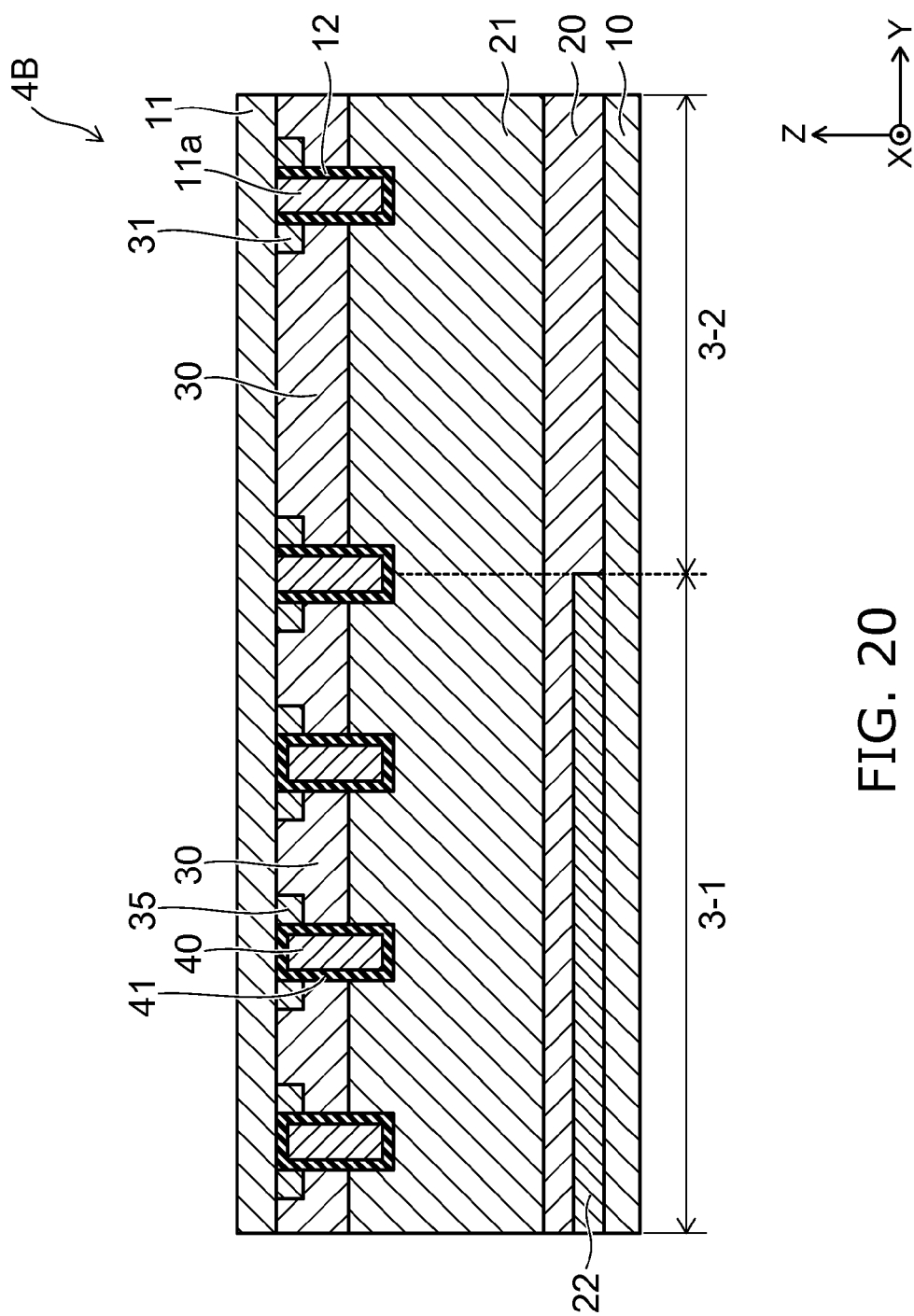
FIG. 20 is a schematic cross-sectional view of a semiconductor device according to a second variation of the fifth embodiment.

An example of when the semiconductor device 1A, the semiconductor device 2A and the IGBT are composite is illustrated in FIGS. 19 and 20.

FIG. 19 is a schematic cross-sectional view of a semiconductor device according to a first example of the fifth embodiment.

A semiconductor device 4A is a composite device provided with an IGBT element provided on a first region 3-1 and a FWD element provided on a second region 3-2.

A collector electrode 10 of the first region 3-1 and a cathode electrode 10 of the second region 3-2 are defined as the first electrode, and an emitter electrode 11 of the first region 3-1 and an anode electrode 11 of the second region 3-2 are defined as the second electrode.

With the first region 3-1, a first region part of the semiconductor layer 20 is provided between the collector electrode 10 and the emitter electrode 11. The first region part of the semiconductor layer 21 is provided between the first region part of the semiconductor layer 20 and the emitter electrode 11. An impurity concentration of the first region part of the semiconductor layer 21 is lower than an impurity concentration of the first region part of the semiconductor layer 20. Further, the semiconductor layer 22 (second semiconductor layer) is a p-type collector layer, and is provided between the collector electrode 10 and the first region part of the semiconductor layer 20. The semiconductor layer 22 contacts the collector electrode 10.

Further, the first region part of the semiconductor region 30 is a p-type base region, and is provided between the first region part of the semiconductor layer 21 and the emitter electrode 11. Furthermore, an n$^+$-type semiconductor region 35 (third semiconductor region) which is an emitter region is provided between the first region part of the semiconductor region 30 and the emitter electrode 11. The impurity concentration of the semiconductor region 35 is higher than the impurity concentration of the semiconductor layer 21. In addition, a plurality of gate electrodes 40 (third electrode) contacts the first region part of the semiconductor layer 21, the first region part of the semiconductor region 30, and the semiconductor region 35 via a gate insulation film 41.

Further, a second region part of the semiconductor layer 20 is provided between the cathode electrode 10 and the anode electrode 11 in the second region 3-2 between the first electrode and the second electrode. The second region part of the semiconductor layer 20 contacts the cathode electrode 10.

The second region part of the semiconductor layer 21 is provided between the first region part of the semiconductor layer 20 and the anode electrode 11. The impurity concentration of the second region part of the semiconductor layer 21 is lower than the impurity concentration of the semiconductor layer 20.

With the semiconductor device 4A, the second region part of the semiconductor region 30 is provided between the second region part of the semiconductor layer 21 and the anode electrode 11, and also contacts the anode electrode 11. The plurality of connection regions 11a contact the anode electrode 11, and reach from the anode electrode 11 to the semiconductor layer 21. In the Y-direction, an array pitch of the plurality of connection regions 11a is wider than an array pitch of the plurality of gate electrodes 40.

The insulating layer 12 is provided between each of the plurality of connection regions 11a and the semiconductor layer 21 and between each of the plurality of connection regions 11a and the semiconductor region 30. The semiconductor region 31 is provided between the semiconductor region 30 and the anode electrode 11, and also contacts the insulating layer 12. In addition, as in FIG. 1, a plurality of semiconductor regions 31 are provided and each extends in a direction (for example, the Y-direction) crossing a direction (for example, the Z-direction) from the cathode electrode 10 toward the anode electrode 11. In addition, each of the semiconductor regions 31 is arrayed in a direction (for example, an X-direction) crossing the Z-direction and the Y-direction (not illustrated). The impurity concentration of the semiconductor region 31 is higher than the impurity concentration of the semiconductor region 30. The semiconductor region 31 contacts the anode electrode 11.

With the semiconductor device 4A, a pitch of the gate electrodes 40 in the Y-direction is defined as a narrow pitch, and a low ON resistance of the IGBT element is achieved. Additionally, the pitch of the connection regions 11a in the Y-direction is expanded more than the pitch of the gate electrodes 40, an injection amount of the holes of the FWD element is suppressed, and the speeding up of the recovery speed of the FWD is achieve.

FIG. 20 is a schematic cross-sectional view of a semiconductor device according to a second variation of the fifth embodiment.

With a semiconductor device 4B, the second region part of the semiconductor region 30 is provided between the second region part of the semiconductor layer 21 and the anode electrode 11, and is also in Schottky contact with the anode electrode 11. The plurality of connection regions 11a contact the anode electrode 11, and reach from the anode electrode 11 to the semiconductor layer 21. In the Y-direction, an array pitch of the plurality of connection regions 11a is wider than an array pitch of the plurality of gate electrodes 40.

The insulating layer 12 is provided between each of the plurality of connection regions 11a and the semiconductor layer 21 and between each of the plurality of connection regions 11a and the semiconductor region 30. The semiconductor region 31 is provided between the semiconductor region 30 and the anode electrode 11, and also contacts the insulating layer 12. The impurity concentration of the semiconductor region 31 is higher than the impurity concentration of the semiconductor region 30. The semiconductor region 31 is in ohmic contact with the anode electrode 11.

With the semiconductor device 4B, a pitch of the gate electrodes 40 in the Y-direction is defined as a narrow pitch, and a low ON resistance of the IGBT element is achieved. Additionally, the pitch of the connection region 11a in the Y-direction is expanded more than the pitch of the gate electrode 40, an injection amount of the holes of the FWD element is suppressed, and the speeding up of the recovery speed of the FWD is achieved. In this manner, it was first found that optimization can be achieved by changing a trench pitch of the IGBT and the FWD.

In the above embodiments, in expressions such as "component A is provided on component B," "on" is sometimes used in the sense that the component A is provided above the component B without the component A contacting the component B, other than the sense that the component A is provided above the component B with the component A contacting the component B. Moreover, "component A is provided above component B" is sometimes applied in situations where the component A and the component B are inverted so the component A is positioned below the component B, and where the component A and the component B are lined up horizontally. This is because a structure of the semiconductor devices does not change before or after rotation when the semiconductor devices according to the embodiments are rotated.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first electrode;
a second electrode;
a first semiconductor layer of a first conductivity type between the first electrode and the second electrode, the first semiconductor layer contacting the first electrode;
a first semiconductor region of a second conductivity type between the first semiconductor layer and the second electrode, the first semiconductor region contacting the second electrode;
a second semiconductor region of the second conductivity type between the first semiconductor region and the second electrode, the second semiconductor region contacting the second electrode, an impurity concentration of the second semiconductor region being higher than an impurity concentration of the first semiconductor region; and
an insulating layer having one end contacting the second electrode and the other end positioned in the first semiconductor layer, the insulating layer extending along the second electrode, and extending in a first direction from the second electrode towards the first electrode,
a maximum value of the impurity concentration of the second semiconductor region is $3 \times 10^{17}$ cm$^{-3}$ or higher.

2. The device according to claim 1, wherein the second semiconductor region is split into a plurality of regions in a second direction crossing the first direction.

3. The device according to claim 1, further comprising a region contacting the second electrode, reaching the first semiconductor layer from the second electrode, and extending in a second direction crossing the first direction,
the insulating layer being provided between the region and the first semiconductor layer and between the region and the first semiconductor region.

4. The device according to claim 1, further comprising a region contacting the second electrode, reaching the first semiconductor layer from the second electrode, and extending in a second direction crossing the first direction,
the insulating layer being provided between the region and the first semiconductor layer and between the region and the first semiconductor region.

5. The device according to claim 1, wherein the second semiconductor region is provided on one side of the region and not provided on one other side.

6. A semiconductor device comprising:
a first electrode;
a second electrode;
a first semiconductor layer of a first conductivity type between the first electrode and the second electrode, the first semiconductor layer contacting the first electrode;

a first semiconductor region of a second conductivity type between the first semiconductor layer and the second electrode, the first semiconductor region contacting the second electrode;
a second semiconductor region of the second conductivity type between the first semiconductor region and the second electrode, the second semiconductor region contacting the second electrode, an impurity concentration of the second semiconductor region being higher than an impurity concentration of the first semiconductor region; and
an insulating layer having one end contacting the second electrode and the other end positioned in the first semiconductor layer, the insulating layer extending along the second electrode, and extending in a first direction from the second electrode towards the first electrode, a maximum value of the impurity concentration of the first semiconductor region is lower than $3 \times 10^{17}$ cm$^{-3}$.

7. The device according to claim 6, wherein the second semiconductor region is split into a plurality of regions in a second direction crossing the first direction.

8. The device according to claim 6, further comprising a region contacting the second electrode, reaching the first semiconductor layer from the second electrode, and extending in a second direction crossing the first direction,
the insulating layer being provided between the region and the first semiconductor layer and between the region and the first semiconductor region.

9. The device according to claim 6, wherein the second semiconductor region contacts the insulating layer.

10. A semiconductor device, comprising:
a first electrode;
a second electrode;
a first semiconductor layer of a first conductivity type between the first electrode and the second electrode, the first semiconductor layer contacting the first electrode;
a first semiconductor region of a second conductivity type between the first semiconductor layer and the second electrode, an maximum value of an impurity concentration of the first semiconductor region being less than $3 \times 10^{17}$ cm$^{-3}$;
an insulating layer having one end contacting the second electrode and the other end positioned in the first semiconductor layer, the insulating layer extending along the second electrode, and extending in a first direction from the second electrode towards the first electrode; and
a second semiconductor region of a second conductivity type between the first semiconductor region and the second electrode, the second semiconductor region contacting the insulating layer, an impurity concentration of the second semiconductor region being higher than an impurity concentration of the first semiconductor region, a maximum value of the impurity concentration of the second semiconductor region being $3 \times 10^{17}$ cm$^{-3}$ or higher.

11. The device according to claim 10, further comprising a region contacting the second electrode and reaching the first semiconductor layer from the second electrode,
the insulating layer being provided between the region and the first semiconductor layer and between the region and the first semiconductor region.

12. The device according to claim 10, wherein the region, the insulating layer, and the second semiconductor region extend in a second direction crossing the first direction.

13. The device according to claim 10, wherein the region and the insulating layer extend in a second direction crossing the first direction,
the second semiconductor region has a first region extending in the second direction and a second region extending in a third direction crossing the second direction.

14. The device according to claim 10, wherein a peak of an impurity concentration profile of the first semiconductor region on a direction from the first electrode toward the second electrode is positioned between the second electrode and the first semiconductor layer.

15. A semiconductor device, comprising:
a first electrode;
a second electrode;
a first semiconductor layer of a first conductivity type between the first electrode and the second electrode, the first semiconductor layer contacting the first electrode;
a first semiconductor region of a second conductivity type between the first semiconductor layer and the second electrode, a maximum value of the impurity concentration of the first semiconductor region being less than $3 \times 10^{17}$ cm$^{-3}$;
an insulating layer having one end contacting the second electrode and the other end positioned in the first semiconductor layer, the insulating layer extending along the second electrode, and extending in a first direction from the second electrode towards the first electrode; and
a second semiconductor region of a second conductivity type between the first semiconductor region and the second electrode, a maximum value of the impurity concentration of the second semiconductor region being $3 \times 10^{17}$ cm$^{-3}$ or greater, the second semiconductor region not contacting the insulating layer.

16. The device according to claim 15, further comprising a region contacting the second electrode, reaching the first semiconductor layer from the second electrode, and extending in a second direction crossing the first direction,
the insulating layer being provided between the region and the first semiconductor layer and between the region and the first semiconductor region.

17. The device according to claim 15, wherein the region, the insulating layer, and the second semiconductor region extend in a second direction crossing the first direction.

18. The device according to claim 15, wherein the region and the insulating layer extend in a second direction crossing the first direction, and
the second semiconductor region is split into a plurality of regions and each of the plurality of regions are aligned in the second direction.

19. A semiconductor device, comprising:
a first electrode;
a second electrode;
a first region part of a first semiconductor layer of a first conductivity type between the first electrode and the second electrode;
a second semiconductor layer of a second conductivity type between the first electrode and the first region part of the first semiconductor layer, the second semiconductor layer contacting the first electrode;
a first region part of the first semiconductor region of a second conductivity type between the first region part of the first semiconductor region and the second electrode;
a third semiconductor region of the first conductivity type between the first region part of the first semiconductor region and the second electrode;
a plurality of third electrodes provided on the first region part of the first semiconductor layer, the first region part of the first semiconductor region, and the third semiconductor region via an insulating film;

a second region part of the first semiconductor layer of the first conductivity type between the first electrode and the second electrode, and the second region part contacting the first electrode;

a second region part of the first semiconductor region of the second conductivity type between the second region part of the first semiconductor layer and the second electrode, the second region part contacting the second electrode;

a plurality of insulating layers having one end contacting the second electrode and the other end positioned in the first semiconductor layer, the plurality of insulating layers extending along the second electrode, and extending in a first direction from the second electrode towards the first electrode, pitches of the plurality of insulating layers arrayed wider than the third electrodes; and a second semiconductor region of the second conductivity type between the first semiconductor region and the second electrode, the second semiconductor region contacting the plurality of insulating layers, having an impurity concentration higher than an impurity concentration of the first semiconductor region, and contacting the second electrode, the first region part of the first semiconductor layer, the second semiconductor layer, the first region part of the first semiconductor region, the third semiconductor region, and the third electrodes being located in a first region between the first electrode and the second electrode, and the second region part of the first semiconductor layer, the second region part of the first semiconductor region, the plurality of insulating layers, and the second semiconductor region being located in a second region between the first electrode and the second electrode.

20. The device according to claim 19, further comprising a plurality of third regions contacting the second electrode, reaching the first semiconductor layer from the second electrode, pitches of the third regions arrayed wider than the third electrodes, the insulating layer being provided between the third regions and the first semiconductor layer and between the third regions and the first semiconductor region.

* * * * *